(12) United States Patent
Kageyama et al.

(10) Patent No.: US 9,627,344 B2
(45) Date of Patent: Apr. 18, 2017

(54) SEMICONDUCTOR DEVICE

(71) Applicant: ROHM CO., LTD., Kyoto (JP)

(72) Inventors: Satoshi Kageyama, Kyoto (JP); Isamu Nishimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/243,245

(22) Filed: Apr. 2, 2014

(65) Prior Publication Data

US 2014/0299990 A1 Oct. 9, 2014

(30) Foreign Application Priority Data

Apr. 4, 2013 (JP) ................................. 2013-078758
Apr. 4, 2013 (JP) ................................. 2013-078759

(51) Int. Cl.
*H01L 23/00* (2006.01)
*H01L 23/495* (2006.01)
(Continued)

(52) U.S. Cl.
CPC ........ *H01L 24/45* (2013.01); *H01L 23/53238* (2013.01); *H01L 24/03* (2013.01); *H01L 24/05* (2013.01); *H01L 24/48* (2013.01); *H01L 24/85* (2013.01); *H01L 23/3121* (2013.01); *H01L 23/4952* (2013.01); *H01L 23/49548* (2013.01); *H01L 23/49582* (2013.01); *H01L 23/53223* (2013.01); *H01L 24/73* (2013.01); *H01L 2224/04026* (2013.01); *H01L 2224/04042* (2013.01); *H01L 2224/05147* (2013.01); *H01L 2224/05155* (2013.01); *H01L 2224/05164* (2013.01); *H01L 2224/05166* (2013.01);
(Continued)

(58) Field of Classification Search
CPC ... H01L 24/45; H01L 24/85; H01L 23/53238; H01L 24/48; H01L 24/05; H01L 24/03; H01L 23/3121; H01L 24/73; H01L 23/49548; H01L 23/4952; H01L 23/49582; H01L 23/53223
See application file for complete search history.

(56) References Cited

U.S. PATENT DOCUMENTS 4,572,925 A * 2/1986 Scarlett .......................... 174/257
5,360,988 A 11/1994 Uda et al.
(Continued)

FOREIGN PATENT DOCUMENTS

JP 2001-319946 A 11/2001
JP 2002-033393 A 1/2002
(Continued)

*Primary Examiner* — Jarrett Stark
(74) *Attorney, Agent, or Firm* — Rabin & Berdo, P.C.

(57) ABSTRACT

The semiconductor device of the present invention includes an insulating layer, a copper wiring for wire connection formed on the insulating layer, a shock absorbing layer formed on an upper surface of the copper wiring, the shock absorbing layer being made of a metallic material with a hardness higher than copper, a bonding layer formed on the shock absorbing layer, the bonding layer having a connection surface for a wire, and a side protecting layer covering a side surface of the copper wiring, wherein the side protecting layer has a thickness thinner than a distance from the upper surface of the copper wiring to the connection surface of the bonding layer.

18 Claims, 21 Drawing Sheets

(51) Int. Cl.
  *H01L 23/532* (2006.01)
  *H01L 23/31* (2006.01)
(52) U.S. Cl.
  CPC ........... *H01L 2224/05557* (2013.01); *H01L 2224/05558* (2013.01); *H01L 2224/05639* (2013.01); *H01L 2224/05644* (2013.01); *H01L 2224/05655* (2013.01); *H01L 2224/32245* (2013.01); *H01L 2224/45144* (2013.01); *H01L 2224/45147* (2013.01); *H01L 2224/48091* (2013.01); *H01L 2224/48247* (2013.01); *H01L 2224/48465* (2013.01); *H01L 2224/48639* (2013.01); *H01L 2224/48644* (2013.01); *H01L 2224/48655* (2013.01); *H01L 2224/48839* (2013.01); *H01L 2224/48844* (2013.01); *H01L 2224/48855* (2013.01); *H01L 2224/73265* (2013.01); *H01L 2224/83439* (2013.01); *H01L 2924/181* (2013.01)

(56) References Cited

U.S. PATENT DOCUMENTS

| | | | |
|---|---|---|---|
| 5,367,195 A * | 11/1994 | DiGiacomo | H01L 23/49811 257/763 |
| 5,431,328 A * | 7/1995 | Chang et al. | 228/180.22 |
| 5,519,658 A | 5/1996 | Uda et al. | |
| 5,855,993 A * | 1/1999 | Brady | C23C 18/50 174/256 |
| 8,435,881 B2 * | 5/2013 | Choi et al. | 438/612 |
| 9,006,097 B2 * | 4/2015 | Lu et al. | 438/613 |
| 2001/0035452 A1 | 11/2001 | Test et al. | |
| 2002/0121703 A1 * | 9/2002 | Toyoda | H01L 21/76834 257/762 |
| 2002/0121709 A1 * | 9/2002 | Matsuki et al. | 257/786 |
| 2004/0110367 A1 * | 6/2004 | Kumakura | H01L 23/3171 438/613 |
| 2010/0133688 A1 * | 6/2010 | Shigihara | H01L 24/06 257/738 |
| 2010/0164105 A1 | 7/2010 | Onai et al. | |
| 2011/0186962 A1 | 8/2011 | Moriyama et al. | |
| 2011/0260317 A1 * | 10/2011 | Lu et al. | 257/737 |
| 2012/0007228 A1 * | 1/2012 | Lu et al. | 257/692 |
| 2012/0007231 A1 * | 1/2012 | Chang | 257/737 |
| 2012/0193787 A1 | 8/2012 | Maitani et al. | |
| 2012/0302009 A1 * | 11/2012 | Sekihara | H01L 24/49 438/121 |
| 2014/0061920 A1 | 3/2014 | Hirano et al. | |

FOREIGN PATENT DOCUMENTS

| | | |
|---|---|---|
| JP | 2004-047510 A | 2/2004 |
| JP | 2007-208181 A | 8/2007 |
| JP | 2008-503879 A | 2/2008 |
| JP | 2008-112825 A | 5/2008 |
| JP | 2008-258511 A | 10/2008 |
| JP | 2009-505404 A | 2/2009 |
| JP | 2010-171386 A | 8/2010 |
| JP | 2011-222963 A | 11/2011 |
| JP | 2012-160512 A | 8/2012 |
| WO | WO-2006/009850 A2 | 1/2006 |
| WO | WO-2007/021736 A2 | 2/2007 |
| WO | WO 2012-176392 A1 | 12/2012 |

* cited by examiner

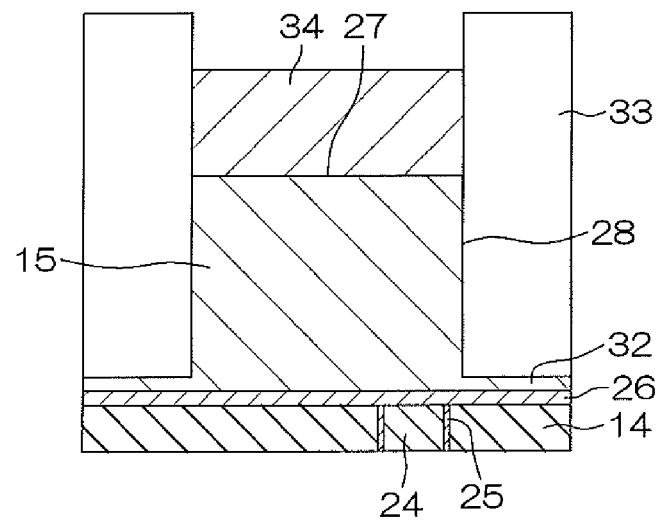
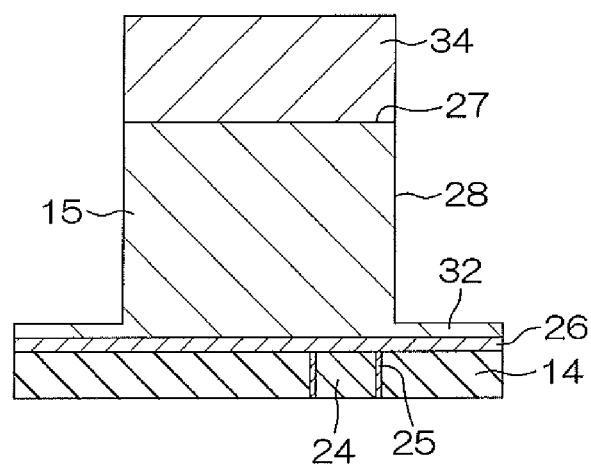

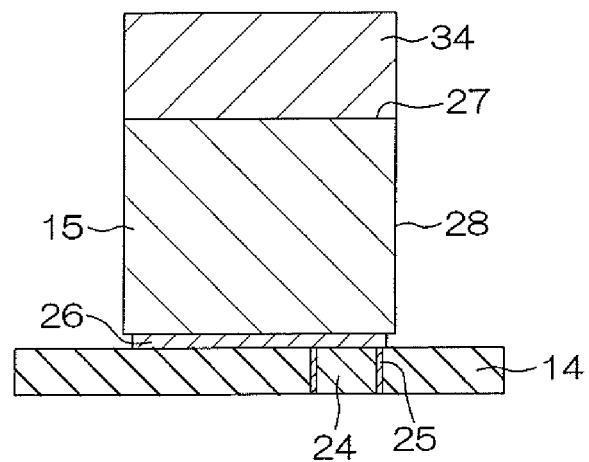
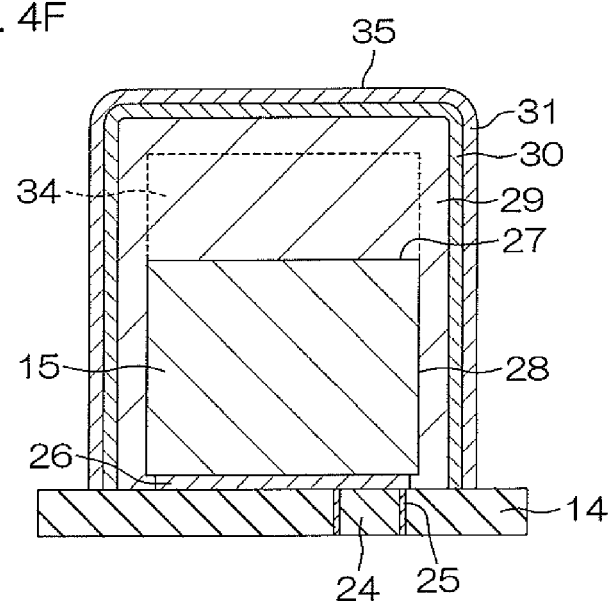

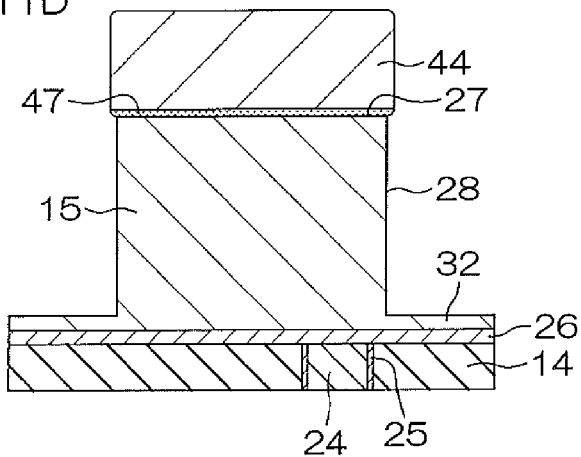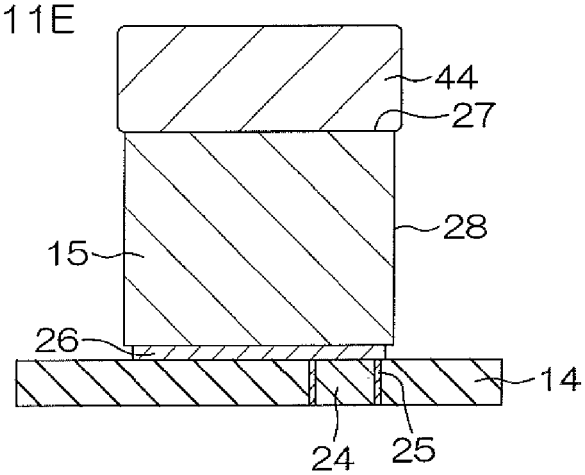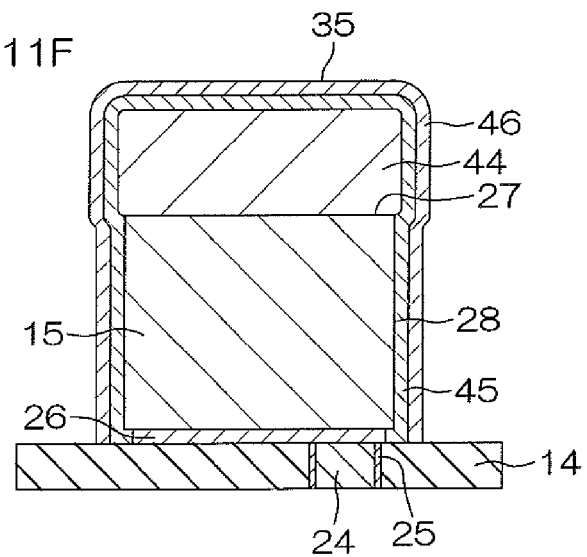

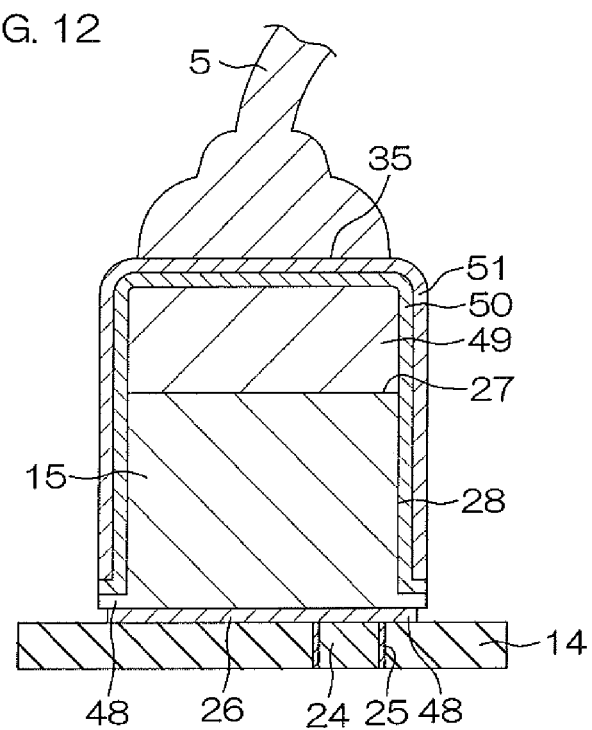

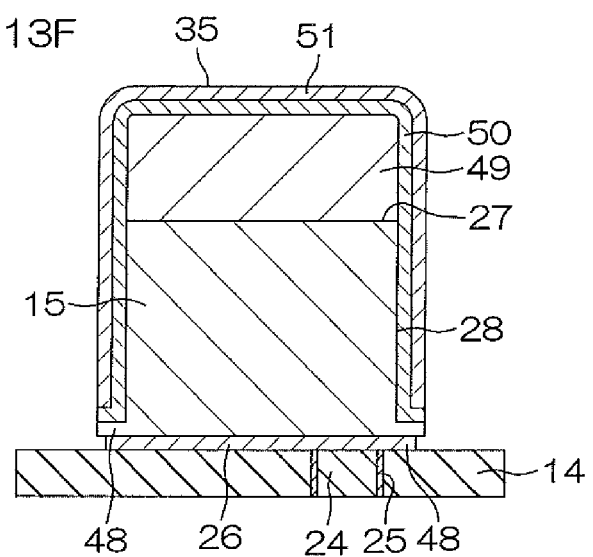

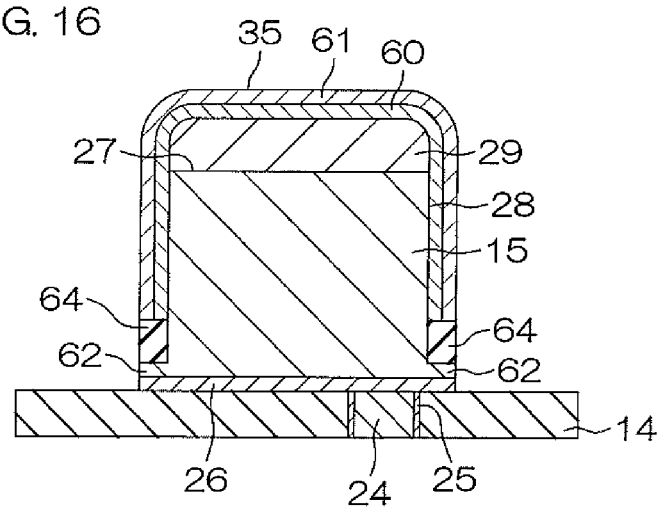

SEMICONDUCTOR DEVICE

CROSS-REFERENCE TO RELATED APPLICATIONS

The present application corresponds to Japanese Patent Application No. 2013-78758 filed in the Japan Patent Office on Apr. 4, 2013 and Japanese Patent Application No. 2013-78759 filed in the Japan Patent Office on Apr. 4, 2013, and the entire disclosures of these applications are incorporated herein by reference.

FIELD OF THE INVENTION

The present invention relates to a semiconductor device that has copper wirings for wire connection.

BACKGROUND ART

It is heretofore known to use copper wirings in a layer to which a bonding wire is connected in order to achieve low resistance.

For example, Patent Literature 1 (Japanese Patent Application Publication No. 2001-319946) discloses a semiconductor device that includes a copper electrode formed on an dielectric substance, a barrier layer made of Ni or the like formed on the copper electrode, and an outermost layer made of Au or the like formed on the barrier layer, and a wire is connected to the outermost layer.

In a process for manufacturing this semiconductor device, both the barrier layer and the outermost layer covering the copper electrode are formed by first forming a seed metal on the surface of the copper electrode and then allowing each material to grow from this seed metal according to electroless plating.

BRIEF SUMMARY OF THE INVENTION

There is a need to form a comparatively thick Ni layer on the copper electrode in order to absorb shocks during wire bonding. However, if a method in which materials are grown isotropically from a seed film is employed in the same way as in electroless plating, Ni will develop plating growth also in a lateral direction of the copper electrode, and therefore an interval between Ni layers on adjacent copper electrodes is liable to be narrowed. Therefore, there is a fear that residues that have been plated along therewith when Ni develops plating growth will become a leak path, and a wire-to-wire short circuit will occur. To prevent this problem, the interval (wire-to-wire distance) between mutually adjacent copper electrodes is required to be widened, this making it difficult to greatly reduce wirings in size.

On the other hand, plating growth may be developed in a state in which the side surface of the copper electrode is covered with a resist film or the like, and, if so, a plated layer will not be formed on the side surface of the copper electrode, and the side surface of the copper electrode will be bared. In this case, there is a fear that the copper electrode will be oxidized from its side surface and will be corroded.

An object of the present invention is to provide a semiconductor device including copper wirings for wire connection that is capable of protecting a side surface of a copper wiring and that is capable of shortening a wiring-to-wiring distance.

BRIEF DESCRIPTION OF THE DRAWINGS

FIG. 4A to FIG. 4F are views to describe a part of a process for manufacturing the copper wiring of FIG. 3.

FIG. 11A to FIG. 11F are views to describe a part of a process for manufacturing the copper wiring of FIG. 10.

FIG. 12 is a view showing a fourth embodiment of the copper wiring.

FIG. 13A to FIG. 13F are views to describe a part of a process for manufacturing the copper wiring of FIG. 12.

FIG. 16 is a view showing a modification of the copper wiring of FIG. 14.

DETAILED DESCRIPTION OF THE INVENTION

Figure 1:
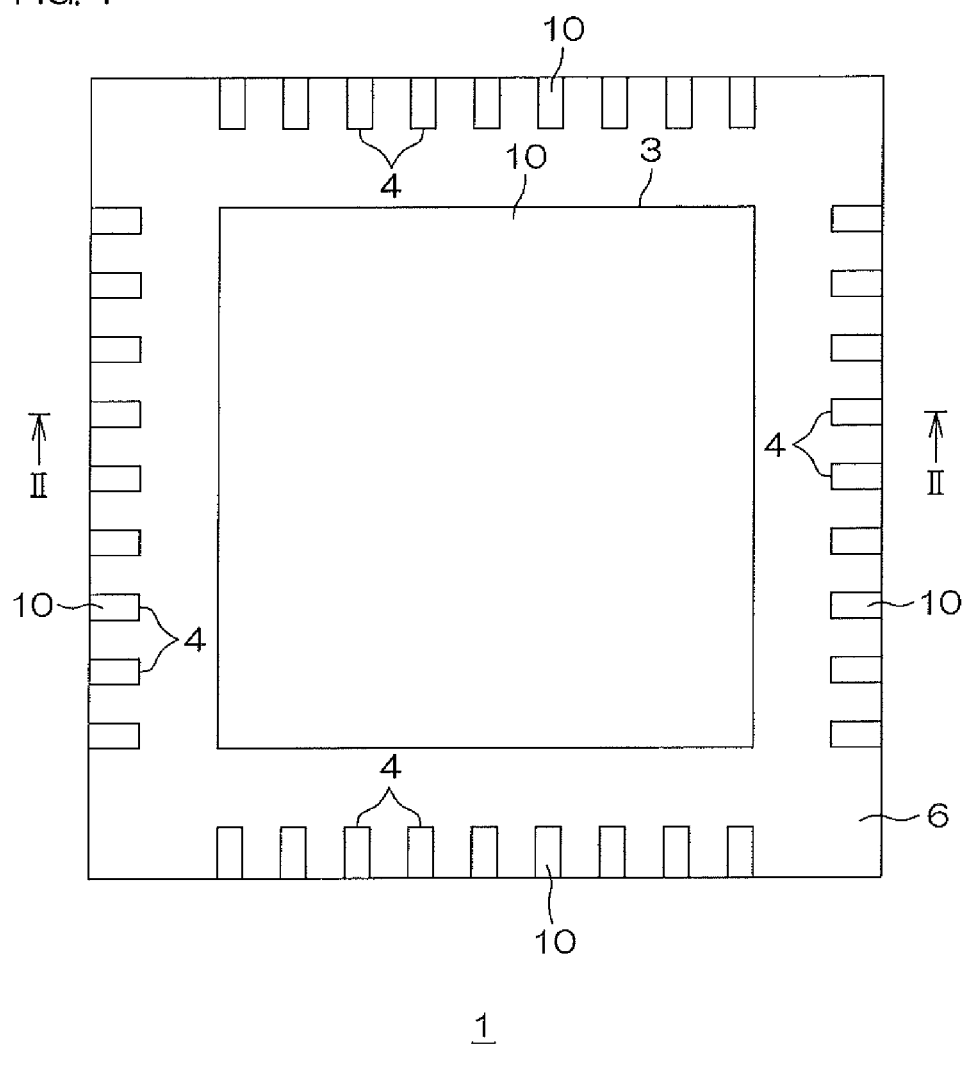
FIG. 1 is a schematic bottom view of a semiconductor device according to an embodiment of the present invention.

The semiconductor device of the present invention includes an insulating layer, a copper wiring for wire connection formed on the insulating layer, a shock absorbing layer formed on an upper surface of the copper wiring, the shock absorbing layer being made of a metallic material with a hardness higher than copper, a bonding layer formed on the shock absorbing layer, the bonding layer having a connection surface for a wire, and a side protecting layer covering a side surface of the copper wiring, wherein the side protecting layer has a thickness thinner than a distance from the upper surface of the copper wiring to the connection surface of the bonding layer.

According to this arrangement, the thickness of the side protecting layer is thinner than the distance from the upper surface of the copper wiring to the connection surface of the bonding layer. Therefore, when a plurality of copper wirings are disposed, the distance between the side protecting layers of adjacent copper wirings can be secured more widely than in a conventional example. As a result, the occurrence of a wiring-to-wiring short circuit can be prevented even if the wiring-to-wiring distance of the copper wiring is shortened.

Additionally, the copper wiring is covered with the shock absorbing layer, with the bonding layer, and with the side protecting layer, and its surface is not exposed, and therefore the copper wiring can be restrained from being oxidized or corroded.

The shock absorbing layer may be selectively formed only on the upper surface of the copper wiring.

According to this arrangement, the thickness of the layer on the side surface of the copper wiring can be made thinner in proportion to an extent resulting from the fact that the shock absorbing layer is not formed on the side surface of the copper wiring.

The bonding layer may have a first portion covering the side surface of the copper wiring and a second portion covering an upper surface of the shock absorbing layer, and the side protecting layer may include the first portion of the bonding layer.

According to this arrangement, the side protecting layer can be formed simultaneously with the formation of the bonding layer, and therefore the manufacturing process can be simplified.

The side protecting layer may completely cover the side surface of the copper wiring from an upper end to a lower end of the copper wiring.

According to this arrangement, the copper wiring can be reliably prevented from being oxidized or corroded by completely covering the side surface of the copper wiring.

On the other hand, the copper wiring may have a projecting portion projecting outwardly at the lower end of the side surface thereof, and the side protecting layer may cover the side surface of the copper wiring from the upper end of the copper wiring to the projecting portion.

The side protecting layer may include a sidewall made of an insulating material.

According to this arrangement, the side protecting layer is made of an insulating material, and therefore the occurrence of a wiring-to-wiring short circuit can be prevented more excellently.

Preferably, the sidewall is made of an SiN film.

The shock absorbing layer may have a side surface flush with the side surface of the copper wiring.

According to this arrangement, the side surface of the shock absorbing layer and the side surface of the copper wiring are flush with each other, and therefore the bonding layer can be excellently formed near an interface therebetween.

On the other hand, the shock absorbing layer may project more sidewardly than the copper wiring such that a level difference is formed between a side surface of the shock absorbing layer and the side surface of the copper wiring.

The shock absorbing layer may have a first portion covering the side surface of the copper wiring and a second portion covering the upper surface of the copper wiring, the first portion may have a thickness thinner than a thickness of the second portion, and the side protecting layer may include the first portion of the shock absorbing layer.

According to this arrangement, the thickness of the layer formed on the side surface of the copper wiring can be made thinner in proportion to an extent resulting from the fact that the shock absorbing layer is thinned at the first portion. Additionally, the side protecting layer can be formed simultaneously with the formation of the shock absorbing layer, and therefore the manufacturing process can be simplified.

Preferably, the bonding layer may have a first portion covering the first portion of the shock absorbing layer and a second portion covering the second portion of the shock absorbing layer, and the side protecting layer further may include the first portion of the bonding layer.

The shock absorbing layer may be made of an Ni film. Additionally, the bonding layer may include a stacked structure consisting of a Pd film and an Au film stacked in this order from the shock absorbing layer. Additionally, in the semiconductor device of the present invention, a barrier film may be interposed between the insulating layer and the copper wiring.

The barrier film may have an end portion disposed more inside than the side surface of the copper wiring.

The side protecting layer may enter a level difference between the side surface of the copper wiring and the end portion of the barrier film below the copper wiring.

The barrier film may be made of Ti.

A plurality of copper wirings each of which is the copper wiring may be formed at a wiring-to-wiring distance of less than 20 μm.

According to this arrangement, the wiring-to-wiring distance is less than 20 μm, and therefore the wiring can be greatly reduced.

A part of the shock absorbing layer disposed on the upper surface of the copper wiring may be 2 μm to 4 μm thickness.

The semiconductor device of the present invention may further include a semiconductor substrate and a multilayer wiring structure disposed on the semiconductor substrate, and the insulating layer may include a passivation film formed on a topmost surface of the multilayer wiring structure.

Embodiments of the present invention and a reference example will be hereinafter described in detail with reference to the accompanying drawings.

Figure 2:
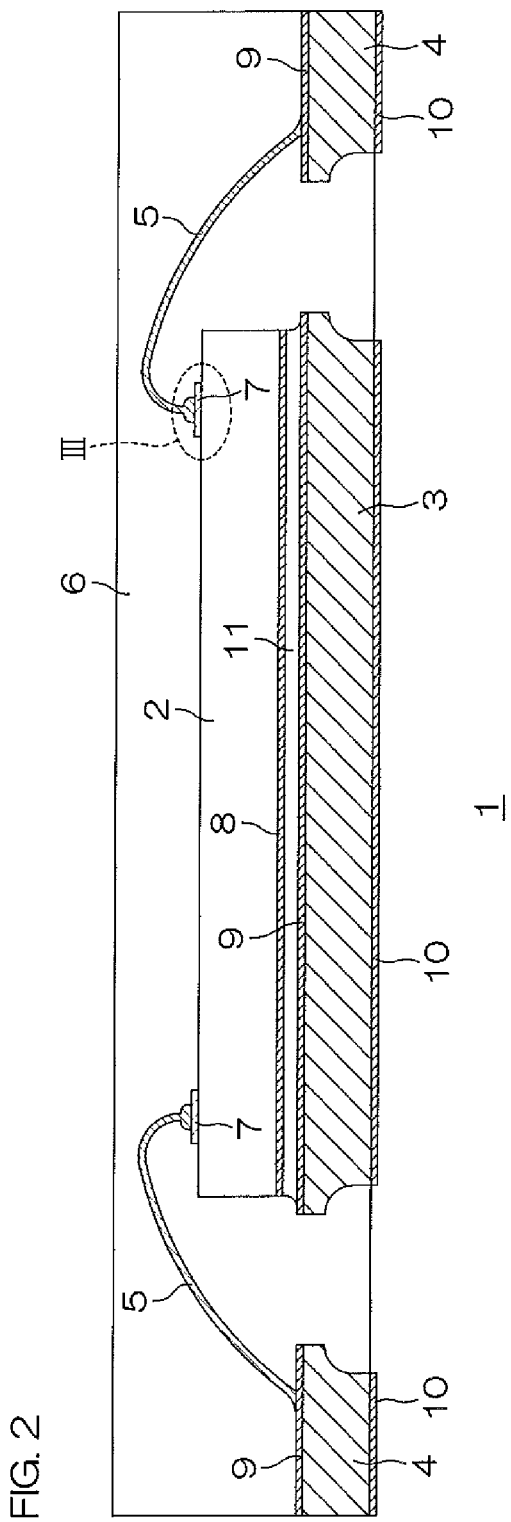
FIG. 2 is a cross-sectional view along cutting plane II-II of FIG. 1.

FIG. 1 is a schematic bottom view of a semiconductor device 1 according to an embodiment of the present invention. FIG. 2 is a cross-sectional view along cutting plane II-II of FIG. 1.

The semiconductor device 1 is a semiconductor device to which a QFN (Quad Flat Non-leaded Package) has been applied, and has a structure in which a semiconductor chip 2 is sealed with a resin package 6 along with a die pad 3, a lead 4, and a copper wire 5. The external shape of the semiconductor device 1 (resin package 6) is a flat rectangular parallelepiped shape.

The exterior of the semiconductor device 1 is, for example, planarly in a square shape of 4 mm square, and is, for example, a hexahedron of 0.85 mm in thickness, and the dimensions of each portion of the semiconductor device 1 mentioned below are one example in a case in which the semiconductor device 1 has those external dimensions.

The semiconductor chip 2 is in a square shape of 2.3 mm when viewed planarly. The thickness of the semiconductor chip 2 is 0.23 mm. A plurality of pads 7 are disposed at a peripheral edge of a surface of the semiconductor chip 2. Each pad 7 is electrically connected to a semiconductor element built on a semiconductor substrate 12 described later. A back metal 8 made of a metallic layer, such as Au, Ni (nickel), or Ag (silver), is formed on a back surface of the semiconductor chip 2.

The die pad 3 and the lead 4 are formed by punching a thin metal plate (e.g., thin copper plate). The thickness of the thin metal plate (the die pad 3 and the lead 4) is 0.2 mm. A plated layer 9 made of Ag is formed on the surface of the die pad 3 and on the surface of the lead 4.

The die pad 3 is in a square shape of 2.7 mm when viewed planarly, and is disposed at the middle of the semiconductor device 1 such that each side surface of the die pad 3 becomes parallel to the side surface of the semiconductor device 1.

A hollow having a substantially ¼ elliptical shape in the cross section is formed at a peripheral edge of the back surface of the die pad 3 over its entire periphery by performing a squeezing operation from the back surface side. The resin package 6 enters the hollow. As a result, the peripheral edge of the die pad 3 is brought into a sandwiched state by means of the resin package 6 from its upper and lower sides, and the die pad 3 is prevented from dropping off (from falling out) from the resin package 6.

Additionally, the back surface of the die pad 3 is exposed from the back surface of the resin package 6 except its peripheral edge (except a hollowed part having a substantially ¼ elliptical shape in the cross section).

The lead 4 is disposed at positions that face each side surface of the die pad 3 so as to be the same in number (e.g., nine leads). At each position facing the side surface of the die pad 3, the leads 4 extend in a direction perpendicular to the side surface faced thereby, and are evenly spaced in a direction parallel to this side surface. The length in the longitudinal direction of the lead 4 is 0.45 mm. The interval between the die pad 3 and the lead 4 is 0.2 mm.

A hollow having a substantially ¼ elliptical shape in the cross section is formed at a die-pad-side end of the back surface of the lead 4 by performing a squeezing operation from the back surface side. The resin package 6 enters the hollow. As a result, the die-pad-side end of the lead 4 is brought into a sandwiched state by means of the resin package 6 from its upper and lower sides, and the lead 4 is prevented from dropping off (from falling out) from the resin package 6.

The back surface of the lead 4 is exposed from the back surface of the resin package 6 except the die-pad-side end (except a hollowed part having a substantially ¼ elliptical shape in the cross section). A side surface opposite to the die-pad side of the lead 4 is exposed from the side surface of the resin package 6.

A plated layer 10 made of solder is formed on parts exposed from the resin package 6 of the back surface of the die pad 3 and of the back surface of the lead 4.

The semiconductor chip 2 has its back surface bonded to the surface (plated layer 10) of the die pad 3 with a junction material 11 therebetween in a state in which its surface on which the pad 7 is placed is directed upwardly. For example, a solder paste is used as the junction material 11. The thickness of the junction material 11 is 0.02 mm.

If an electric connection between the semiconductor chip 2 and the die pad 3 is unnecessary, the back metal 8 may be excluded, and the back surface of the semiconductor chip 2 may be bonded to the surface of the die pad 3 with a junction material made of an insulating paste, such as a silver paste, therebetween. In this case, the planar size of the semiconductor chip 2 is 2.3 mm square. Additionally, the plated layer 9 on the surface of the die pad 3 may be excluded.

The copper wire 5 is made of, for example, copper whose purity is 99.99% or more. One end of the copper wire 5 is bonded to the pad 7 of the semiconductor chip 2. The other end of the copper wire 5 is bonded to the surface of the lead 4. The copper wire 5 is stretched between the semiconductor chip 2 and the lead 4 while drawing an arched loop. A difference in height between the top of the loop of the copper wire 5 and the surface of the semiconductor chip 2 is 0.16 mm.

Next, four embodiments of the pad 7 (copper wiring 15) will be described along with a structure of the semiconductor chip 2.

<First Embodiment>

Figure 3:
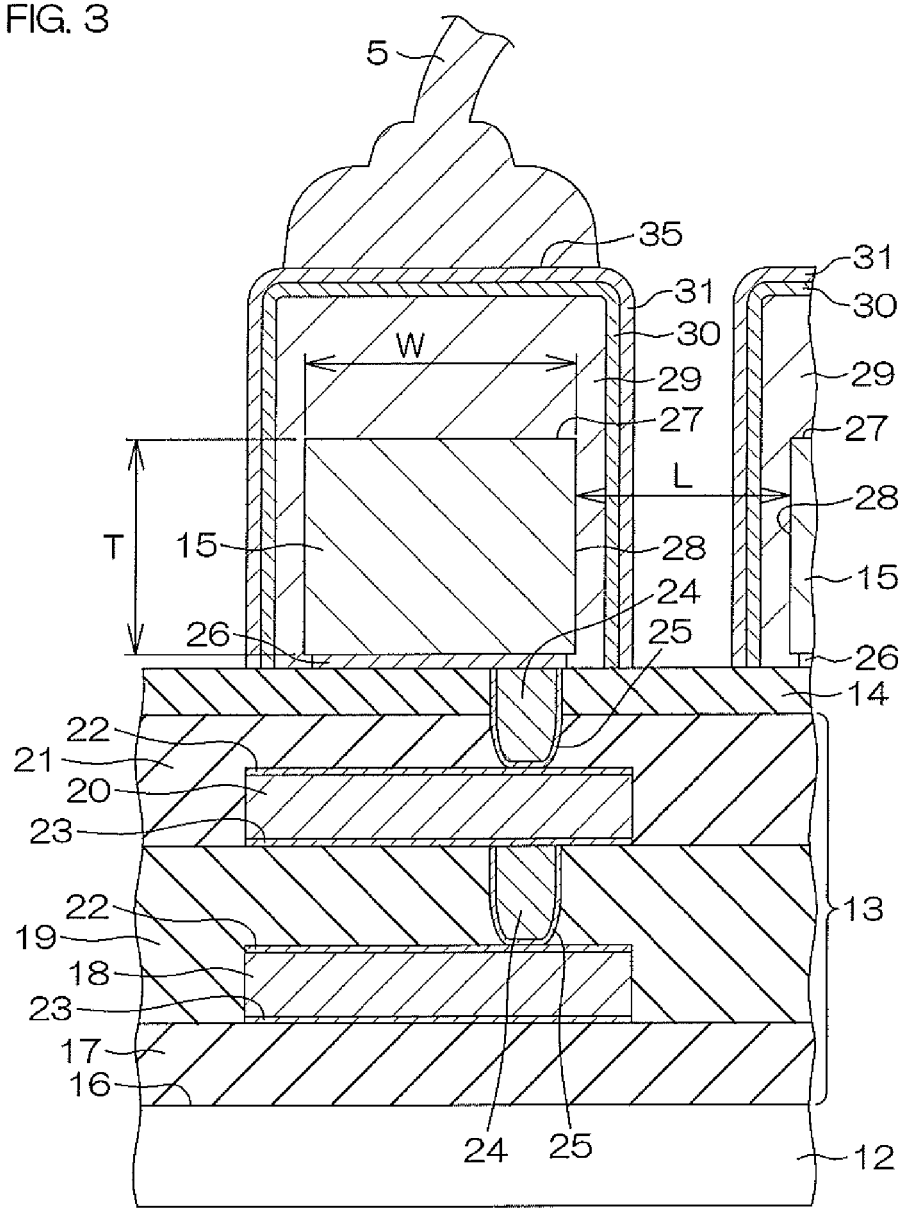
FIG. 3 is an enlarged view of a part enclosed by a broken-line circle III of FIG. 2, showing a first embodiment of a copper wiring.

FIG. 3 is an enlarged view of a part enclosed by a broken-line circle III of FIG. 2, and shows a first embodiment of the copper wiring 15.

The semiconductor chip 2 includes the semiconductor substrate 12, a lower wiring 13, a passivation film 14 that is one example of an insulating layer of the present invention, and the copper wiring 15.

For example, the semiconductor substrate 12 is a silicon substrate having a surface 16 on which semiconductor elements (diodes, transistors, resistors, capacitors, etc.) are formed.

The lower wiring 13 has a multilayer wiring structure in which a plurality of wiring layers are stacked together with an interlayer film therebetween in order from the surface 16 of the semiconductor substrate 12. In the present embodiment, the lower wiring 13 includes a first metal layer 18 stacked on the surface 16 of the semiconductor substrate 12 with a first interlayer film 17 therebetween, a second metal layer 20 stacked on the first metal layer 18 with a second interlayer film 19 therebetween, and a third interlayer film (uppermost interlayer film) 21 covering the second metal layer 20.

The first interlayer film 17, the second interlayer film 19, and the third interlayer film 21 are made of an insulation material such as silicon oxide ($SiO_2$). The first metal layer 18 and the second metal layer 20 are made of aluminum (aluminum wiring). Let it be supposed that pure aluminum that contains 100% Al and an aluminum alloy consisting of Al and other metals (e.g., Al—Cu alloy, Al—Si alloy, Al—Si—Cu alloy, etc.) are included in "aluminum" used for the wiring of the present embodiment (the same applies hereinafter).

Barrier films 22 and 23 that prevent impurities from diffusing into the first to third interlayer films 17, 19, and 21 are formed on the upper and lower surfaces of the first metal layer 18 and on those of the second metal layer 20, respectively. The upper barrier films 22 formed on the upper surfaces of the first and second metal layers 18 and 20 are made of, for example, titanium nitride (TiN). On the other hand, the lower barrier films 23 formed on the lower surfaces of the first and second metal layers 18 and 20 have, for example, a two-layer structure (TiN/Ti) in which titanium nitride (TiN) and titanium (Ti) are stacked together in this order from the lower surfaces of the first and second metal layers 18 and 20.

The passivation film 14 is made of an insulating material such as silicon nitride (SiN). The passivation film 14 is formed on the third interlayer film 21.

Vias 24 that penetrate the insulating films over the upper surfaces of the first and second metal layers 18 and 20 are connected to the upper surfaces of the first and second metal layers 18 and 20, respectively. In the present embodiment, the via 24 connected to the upper surface of the first metal layer 18 penetrates the second interlayer film 19, and is connected to the lower surface of the second metal layer 20. On the other hand, the via 24 connected to the upper surface of the second metal layer 20 penetrates the third interlayer film 21 and the passivation film 14, and is exposed from the surface of the passivation film 14 so as to become flush with this surface. This exposed part is connected to the lower surface of the copper wiring 15 as describe later. A barrier film 25 made of, for example, titanium nitride (TiN) is interposed between the via 24 and the insulating film (in the present embodiment, the second interlayer film 19, the third interlayer film 21, and the passivation film 14).

The copper wiring 15 is made of, for example, copper (e.g., high-purity copper whose purity is 99.9999% (6N) or more or whose purity is 99.99% (4N) or more and, in some cases, including a slight amount of impurities), and a plurality of copper wirings 15 are spaced on the passivation film 14. In the present embodiment, the distance (wiring-to-wiring distance L) between adjacent copper wirings 15 is, for example, less than 20 μm, and, preferably, about 10 μm. Each copper wiring 15 is formed in a quadrangle that has an upper surface 27 and a side surface 28 when viewed cross-sectionally along the normal direction of the passivation film 14 (hereinafter, referred to simply as "when viewed cross-sectionally"). The size of the thus shaped copper wiring 15 is, for example, about 7 μm to 10 μm in thickness T, and is, for example, about 10 μm in width W.

Additionally, each copper wiring 15 is formed so as to cover the via 24 exposed from the surface of the passivation film 14, and is connected to the via 24 through the barrier film 26 interposed between the passivation film 14 and the copper wiring 15.

In the present embodiment, the barrier film 26 is made of, for example, titanium (Ti). Additionally, the barrier film 26 is formed such that its both ends are located inside the side surface 28 of the copper wiring 15 when viewed cross-sectionally.

An Ni (nickel) film 29 that is one example of a shock absorbing layer of the present invention, a Pd (palladium) film 30 that is one example of a bonding layer of the present invention, and an Au (gold) film 31 are stacked together in this order from the copper wiring 15 in such a way as to cover each copper wiring 15.

The Ni film 29 is formed such that its one surface and its other surface follow the upper surface 27 and the side surface 28 of the copper wiring 15, and covers the upper surface 27 and the side surface 28. Additionally, the Ni film 29 enters a level difference (groove) formed between the side surface 28 and the end of the barrier film 26 below the side surface 28. In the Ni film 29, a part contiguous to the side surface 28 of the copper wiring 15 is selectively thinner than a part contiguous to the upper surface 27. In the Ni film 29, the thickness of the part contiguous to the upper surface 27 is, for example, 2 μm to 4 μm, whereas the thickness of the part contiguous to the side surface 28 is thinner than the foregoing one, and is, for example, 0 μm to 1 μm.

The Pd film 30 is formed such that its one surface and its other surface follow the upper surface 27 and the side surface 28 of the copper wiring 15, and covers the upper surface and the side surface of the Ni film 29. The Pd film 30 is formed with a uniform thickness. The thickness of the Pd film 30 is, for example, 0.1 μm to 0.5 μm.

The Au film 31 is formed such that its one surface and its other surface follow the upper surface 27 and the side surface 28 of the copper wiring 15, and covers the upper surface and the side surface of the Pd film 30. The Au film 31 is formed with a uniform thickness that is thinner than the Pd film 30. The thickness of the Au film 31 is, for example, 0 μm to 0.05 μm.

These stacked films 29 to 31 consisting of the Ni film 29, the Pd film 30, and the Au film 31 protect the side surface 28 of the copper wiring 15 by covering the side surface 28 as one example of a side protecting layer of the present invention. Additionally, a difference in the film thickness is provided to the Ni film 29 in these stacked films 29 to 31, and therefore a part on the side surface 28 of the copper wiring 15 is thinner than the distance from the upper surface 27 of the copper wiring 15 to a wire connection surface 35 (upper surface of the Au film 31) of the copper wire 5 in the stacked films 29 to 31.

In the present embodiment, the copper wiring 15 coated with the Ni film 29, with the Pd film 30, and with the Au film 31 is exposed to the surface of the semiconductor chip 2 in the form of the pad 7. The copper wire 5 is bonded to the Au film 31 exposed to the topmost surface of the pad 7.

Next, a process for manufacturing the copper wiring 15 of the first embodiment will be described.

FIG. 4A to FIG. 4F are views to describe a part of the manufacturing process of the copper wiring 15 of FIG. 3 in order of process steps. In the following description, let it be supposed that electrolytic plating is performed in a temperature environment of, for example, room temperature (about 20° C. or 25° C.) and that electroless plating is performed in a plating solution of, for example, about 90° C.

First, before forming the copper wiring 15, the lower wiring 13 (see FIG. 3) is formed on the semiconductor substrate 12 (see FIG. 3) according to a well-known multi-layer wiring manufacturing technique, and then the passivation film 14 is formed, and the via 24 that penetrates this passivation film 14 is formed.

Figure 4A:
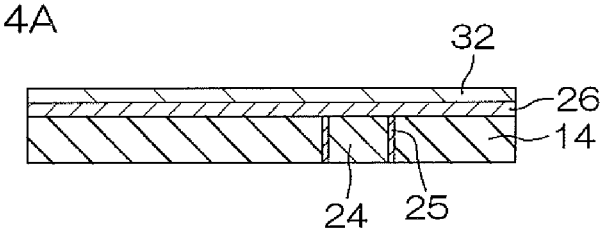

Thereafter, as shown in FIG. 4A, the barrier film 26 and a copper seed film 32 are formed on the surface of the passivation film 14 in this order, for example, according to a sputtering method.

Figure 4B:
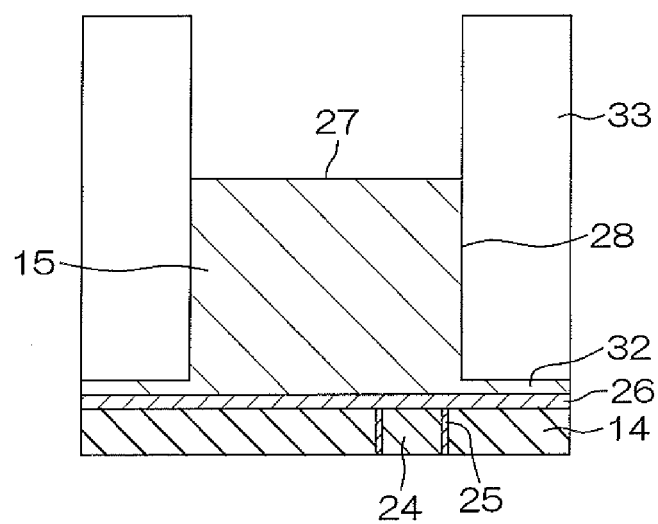

Thereafter, as shown in FIG. 4B, a resist film 33 that is one example of a mask of the present invention selectively having an opening in a region in which each copper wiring 15 is to be formed is formed on the copper seed film 32. Thereafter, copper is subjected to plating growth by means of electrolytic plating from the surface of the copper seed film 32 selectively exposed from the opening. As a result, the copper wiring 15 is formed. In this state, the copper wiring 15 has its side surface 28 covered with the resist film 33. Additionally, adjacent copper wirings 15 are in a mutually electrically connected state through the copper seed film 32 covered with the resist film 33.

Thereafter, as shown in FIG. 4C, Ni is subjected to plating growth by means of electrolytic plating from the upper surface 27 of the copper wiring 15 selectively exposed from the opening of the resist film 33. As a result, an upper-surface Ni film 34 (e.g., about 3 μm in thickness) brought into a sandwiched state from both sides by means of the resist film 33 is formed on the upper surface 27 of the copper wiring 15.

Thereafter, as shown in FIG. 4D, the resist film 33 is removed. As a result, the side surface 28 of the copper wiring 15 covered with the resist film 33 and the side surface of the upper-surface Ni film 34 covered with the resist film 33 are exposed.

Thereafter, as shown in FIG. 4E, the copper seed film 32 other than the copper wiring 15 and the barrier film 26 disposed thereunder are selectively removed, for example, according to wet etching. At this time, the end of the barrier film 26 is etched more inwardly than the side surface 28 of the copper wiring 15 because of characteristics of wet etching (isotropic etching), and a level difference is created between the end of the barrier film 26 and the side surface 28.

Thereafter, as shown in FIG. 4F, Ni is subjected to plating growth by means of electroless plating from the entire surface (side surface 28) of the exposed copper wiring 15 and from the entire surface of the upper-surface Ni film 34. Although Ni isotropically develops plating growth with a uniform thickness because of electroless plating, the upper-surface Ni film 34 has already been formed on the upper surface 27 of the copper wiring 15, and therefore, in the Ni film 29 formed after the growth, a part contiguous to the side surface 28 of the copper wiring 15 selectively becomes thinner than a part contiguous to the upper surface 27. Thereafter, electroless plating is further performed, and Pd and Au are subjected to plating growth, and, as a result, the Pd film 30 and the Au film 31 are formed.

The copper wiring 15 coated with the stacked films 29 to 31 consisting of the Ni film 29, the Pd film 30, and the Au film 31 is formed through the steps mentioned above.

As described above, according to the present embodiment, the upper-surface Ni film 34 is formed before forming the stacked films 29 to 31 consisting of the Ni film 29, the Pd film 30, and the Au film 31 (see FIG. 4C). As a result, a film thickness necessary to absorb shocks when the copper wire 5 is bonded can be secured in the region over the upper surface 27 of the copper wiring 15. Therefore, when the stacked films 29 to 31 are subjected to electroless plating, it is only necessary to allow Ni to grow on the upper surface 27 of the copper wiring 15 so as to be comparatively thin, and therefore it is possible to thin the film thickness of Ni that simultaneously develops plating growth from the side surface 28 when Ni is subjected to plating growth. As a result, the stacked films 29 to 31 covering the side surface 28 of the copper wiring 15 can be made thinner than in a case in which Ni, Pd, and Au are evenly grown by electroless plating from the upper surface 27 and the side surface 28 of the bare copper wiring 15.

As a result, the distance between the stacked films 29 to 31 of adjacent copper wirings 15 can be secured comparatively widely, and therefore the occurrence of a wiring-to-wiring short circuit can be prevented even if the wiring-to-wiring distance L of the copper wiring 15 is shortened. Additionally, the copper wiring 15 is completely covered with the stacked films 29 to 31 consisting of the Ni film 29, the Pd film 30, and the Au film 31, and its surface is not exposed, and therefore the copper wiring 15 can be restrained from being oxidized or corroded.

Additionally, all platings can be treated by electroless plating after forming the upper-surface Ni film 34. Electroless plating is bathtub type plating unlike one-by-one type electrolytic plating, and wafers can be treated at a time even if the wafers differ from each other in size. Therefore, the productivity of the semiconductor device 1 can be improved. Additionally, this electroless plating is performed after removing the resist film 33, and therefore it is also possible to avoid the fact that the resist film 33 is deformed by being influenced by the plating temperature (about 90° C.) of electroless plating.

Figure 5:
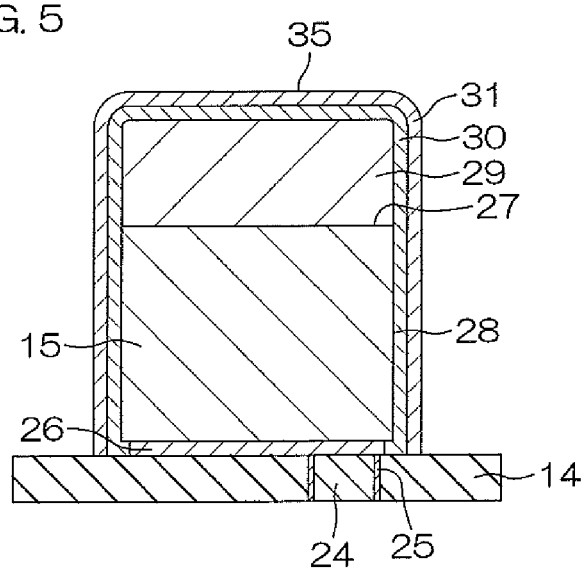
FIG. 5 is a view showing a modification of the copper wiring of FIG. 3.
Figure 6:
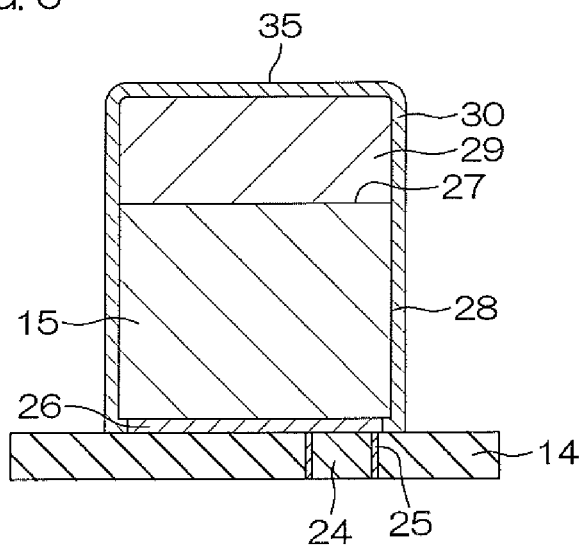
FIG. 6 is a view showing another modification of the copper wiring of FIG. 3.
Figure 7:
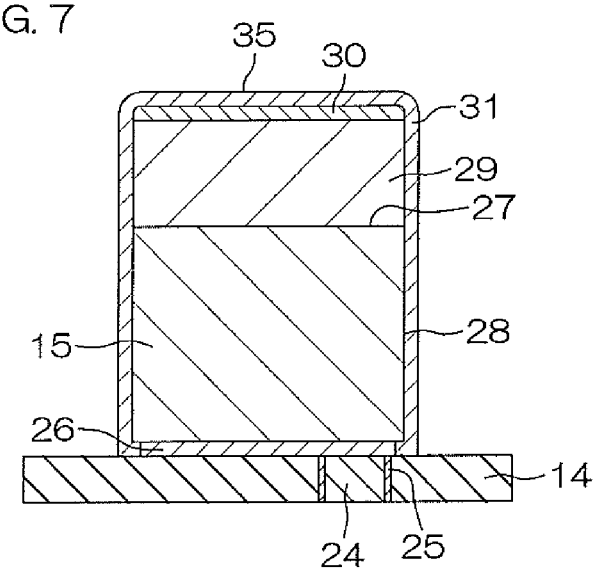
FIG. 7 is a view showing still another modification of the copper wiring of FIG. 3.

In the present embodiment, it is also possible to apply modifications shown in FIG. 5 to FIG. 7 to the copper wiring 15.

For example, in FIG. 5, the Ni film 29 is selectively formed only on the upper surface 27 so as to expose the side surface 28 of the copper wiring 15. In this case, the side surface 28 of the copper wiring 15 is covered with the stacked films 30 and 31 consisting of the Pd film 30 and the Au film 31. This arrangement can be obtained, for example, by forming the upper-surface Ni film 34 formed in FIG. 4C as the Ni film 29 and by excluding the electroless plating of Ni in the step of FIG. 4F. In other words, the Ni film 29 is formed by plating growth at the opening of the resist film 33, and therefore its side surface is formed so as to be flush with the side surface 28 of the copper wiring 15 (so as to have no level difference).

Additionally, in FIG. 6, the Au film 31 is also excluded in the arrangement of FIG. 5. This arrangement can be obtained, for example, by further excluding the electroless plating of Au in the step of FIG. 4F.

Additionally, in FIG. 7, the Pd film 30 is also selectively formed only on the Ni film 29 in the arrangement of FIG. 5 so as to expose the side surface 28 of the copper wiring 15 in the same way as the Ni film 29. In this case, the side surface 28 of the copper wiring 15 is covered with the single layer film of the Au film 31. This arrangement can be obtained, for example, by forming the Pd film 30 by means of electrolytic plating after forming the Ni film 29 in the step of FIG. 4C and by excluding the electroless plating of Pd in the step of FIG. 4F. As a result, the Pd film 30 is also formed such that its side surface becomes flush with the side surface 28 of the copper wiring 15 (no level difference is created) in the same way as the Ni film 29 of FIG. 5.

The stacked films or the single layer film covering the side surface 28 of the copper wiring 15 can be made thinner by these modifications than in conventional examples, and therefore it is possible to shorten the wiring-to-wiring distance L of the copper wiring 15 while preventing the occurrence of a wiring-to-wiring short circuit.

<Second Embodiment>

Figure 8:
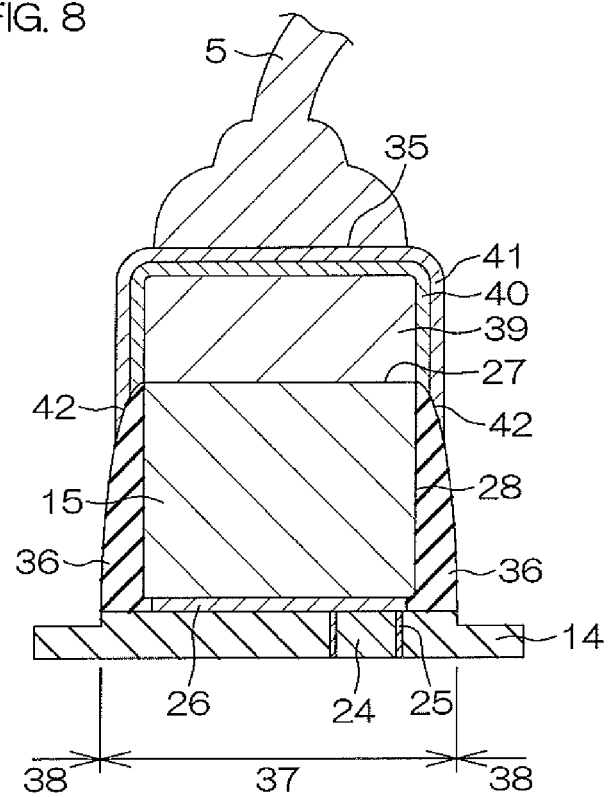
FIG. 8 is a view showing a second embodiment of the copper wiring.

FIG. 8 is a view showing a second embodiment of the copper wiring 15. In FIG. 8, only the copper wiring 15 and regions therearound are shown, and the structure etc., of the semiconductor chip 2 are neither shown nor described. Additionally, in FIG. 8, the same reference sign is given to a component equivalent to each component of FIG. 3 shown above, and a description of this component is omitted.

In this second embodiment, a sidewall 36 that is one example of the side protecting layer of the present invention is formed on the side surface 28 of each copper wiring 15. As a result, the side surface 28 of the copper wiring 15 is protected by the sidewall 36. The sidewall 36 is made of an insulating film selectively formed on the side surface 28 so as to expose the upper surface 27 of the copper wiring 15. In the present embodiment, the sidewall 36 is made of an SiN film that is the same material as the passivation film 14, and its thickness is, for example, 0.1 μm to 1 μm. Additionally, as shown in FIG. 8, the sidewall 36 may have a tapered outer surface 42 inclined with respect to the side surface 28 by becoming thinner in proportion to an approach to the upper surface 27 from the lower surface of the copper wiring 15.

Additionally, in the passivation film 14, a non-wiring region 38 other than the formation region (wiring region 37) of the copper wiring 15 coated with the sidewall 36 is formed in a concave portion by being selectively dug down, and, as a result, the wiring region 37 becomes a mesa portion that protrudes more outwardly than the non-wiring region 38. In the present embodiment, the concave portion of the non-wiring region 38 is formed in a self-aligned manner with respect to the sidewall 36.

An Ni (nickel) film 39 that is one example of the shock absorbing layer of the present invention, a Pd (palladium) film 40 that is one example of the bonding layer of the present invention, and an Au (gold) film 41 are stacked together in this order from the copper wiring 15 in such a way as to cover the upper surface 27 of the copper wiring 15 exposed from the sidewall 36.

The Ni film 39 is formed with a uniform thickness on the upper surface 27 of the copper wiring 15 such that its side surface becomes flush with the side surface 28 of the copper wiring 15. The thickness of the Ni film 39 is, for example, 2 μm to 4 μm.

The Pd film 40 is formed such that its one surface and its other surface follow the upper surface and the side surface of the Ni film 39, and covers the upper surface and the side surface of the Ni film 39, and covers the outer surface 42 of the sidewall 36 while crossing an interface between the Ni film 39 and the copper wiring 15. The Pd film 40 is formed with a uniform thickness. The thickness of the Pd film 40 is, for example, 0.1 μm to 0.5 μm.

The Au film 41 is formed such that its one surface and its other surface follow the upper surface and the side surface of the Ni film 39, and covers the upper surface and the side surface of the Pd film 40, and covers the outer surface 42 of the sidewall 36 beside the Pd film 40 while crossing the interface between the Ni film 39 and the copper wiring 15. The Au film 41 is formed with a uniform thickness that is thinner than the Pd film 40. The thickness of the Au film 41 is, for example, 0 μm to 0.05 μm.

Additionally, in the present embodiment, the sidewall 36 is thinner than the layer thickness of the stacked films 39 to 41 consisting of the Ni film 39, the Pd film 40, and the Au film 41 (the distance from the upper surface 27 of the copper wiring 15 to the wire connection surface 35 of the stacked films 39 to 41). The copper wiring 15 coated with the stacked films 39 to 41 consisting of the Ni film 39, the Pd film 40, and the Au film 41 and coated with the sidewall 36 is exposed to the surface of the semiconductor chip 2 in the form of the pad 7. The copper wire 5 is bonded to the Au film 41 exposed to the topmost surface of the pad 7.

Next, a process for manufacturing the copper wiring 15 of the second embodiment will be described.

FIG. 9A to FIG. 9F are views to describe a part of the manufacturing process of the copper wiring 15 of FIG. 8 in order of process steps. In the following description, let it be supposed that electrolytic plating is performed in a temperature environment of, for example, room temperature (about 20° C. or 25° C.) and that electroless plating is performed in a plating solution of, for example, about 90° C.

First, before forming the copper wiring 15, the lower wiring 13 (see FIG. 3) is formed on the semiconductor substrate 12 (see FIG. 3) according to a well-known multi-layer wiring manufacturing technique, and then the passivation film 14 is formed, and the via 24 that penetrates this passivation film 14 is formed.

Figure 9A:
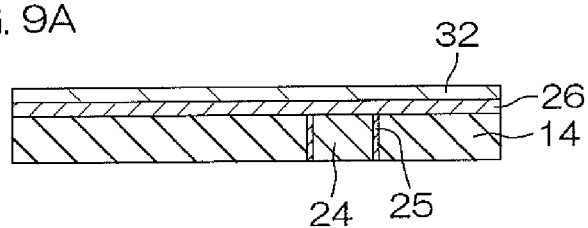
FIG. 9A to FIG. 9F are views to describe a part of a process for manufacturing the copper wiring of FIG. 8.

Thereafter, as shown in FIG. 9A, the barrier film 26 and the copper seed film 32 are formed on the surface of the passivation film 14 in this order, for example, according to the sputtering method.

Figure 9B:
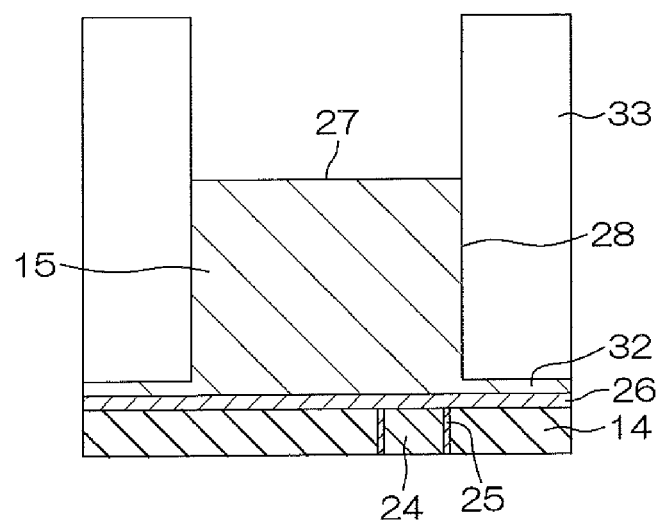

Thereafter, as shown in FIG. 9B, the resist film 33 selectively having an opening in a region in which each copper wiring 15 is to be formed is formed on the copper seed film 32. Thereafter, copper is subjected to plating growth by means of electrolytic plating from the surface of the copper seed film 32 selectively exposed from the opening. As a result, the copper wiring 15 is formed. In this state, the copper wiring 15 has its side surface 28 covered with the resist film 33. Additionally, adjacent copper wirings 15 are in a mutually electrically connected state through the copper seed film 32 covered with the resist film 33.

Figure 9C:
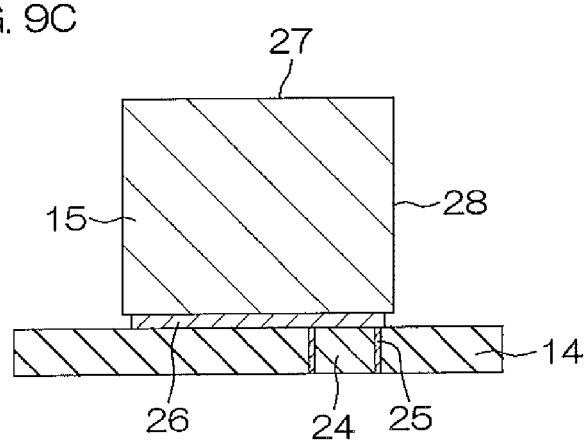

Thereafter, as shown in FIG. 9C, the resist film 33 is removed. As a result, the side surface 28 of the copper wiring 15 covered with the resist film 33 is exposed. Thereafter, the copper seed film 32 other than the copper wiring 15 and the barrier film 26 disposed thereunder are selectively removed, for example, according to wet etching. At this time, the end of the barrier film 26 is etched more inwardly than the side surface 28 of the copper wiring 15 because of characteristics of wet etching (isotropic etching), and a level difference is created between the end of the barrier film 26 and the side surface 28.

Figure 9D:
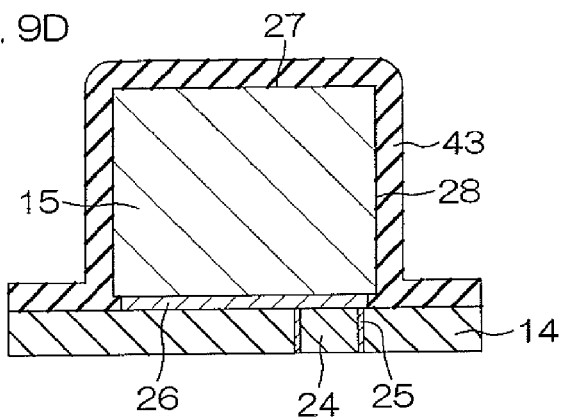

Thereafter, as shown in FIG. 9D, an insulating film 43 is formed on the passivation film 14 so as to cover the copper wiring 15, for example, according to a CVD method. This insulating film 43 is made of the same material as the sidewall 36.

Figure 9E:
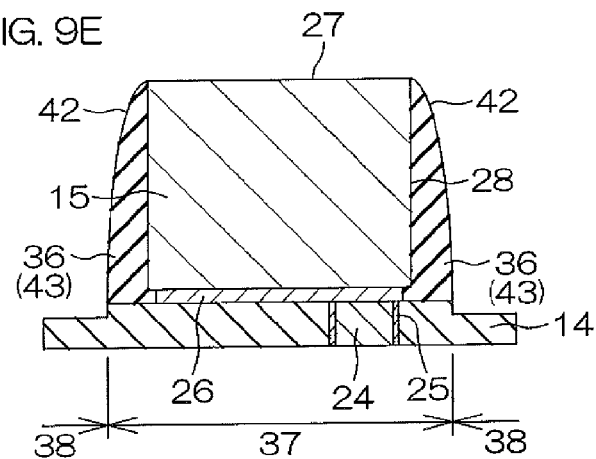

Thereafter, as shown in FIG. 9E, the insulating film 43 is selectively removed, for example, according to etchback, and, as a result, the sidewall 36 is formed. In this case, a part of the surface of the passivation film 14 made of the same material as the insulating film 43 is subjected to over-etching, and, as a result, a concave portion of the non-wiring region 38 is formed.

Figure 9F:
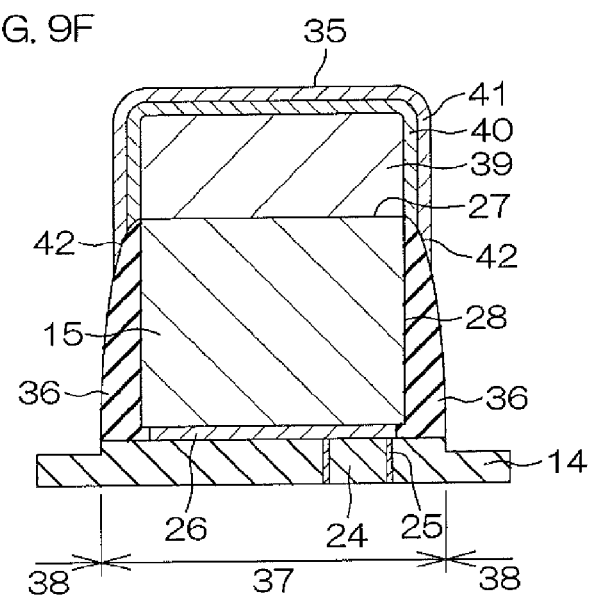

Thereafter, as shown in FIG. 9F, Ni, Pd, and Au are subjected to plating growth from the upper surface 27 of the copper wiring 15 exposed from the sidewall 36 by means of electroless plating. As a result, the Ni film 39, the Pd film 40, and the Au film 41 are formed.

The copper wiring 15 coated with the stacked films 39 to 41 consisting of the Ni film 39, the Pd film 40, and the Au film 41 and coated with the sidewall 36 is formed through the steps mentioned above.

As described above, according to the present embodiment, the sidewall 36 is formed before forming the stacked films 39 to 41 consisting of the Ni film 39, the Pd film 40, and the Au film 41. Therefore, when the stacked films 39 to 41 are subjected to electroless plating, the materials of the stacked films 39 to 41 can be prevented from developing plating growth from the side surface 28 of the copper wiring 15. Moreover, this sidewall 36 is thinner than the layer thickness of the stacked films 39 to 41. As a result, the protection film (sidewall 36) covering the side surface 28 of the copper wiring 15 can be made thinner than in a case in which Ni, Pd, and Au are evenly grown by electroless plating from the upper surface 27 and the side surface 28 of the bare copper wiring 15.

As a result, the distance between the sidewalls 36 of adjacent copper wirings 15 can be secured comparatively widely, and therefore the occurrence of a wiring-to-wiring short circuit can be prevented even if the wiring-to-wiring distance L of the copper wiring 15 is shortened. Additionally, etching residues of the barrier film 26 generated in, for example, the step of FIG. 9C can be removed together by applying over-etching onto a part of the surface of the passivation film 14 when the sidewall 36 is formed. As a result, Ni etc., can be prevented from developing plating growth at apart other than the copper wiring 15, and therefore a wiring-to-wiring short circuit can be effectively prevented.

Additionally, the copper wiring 15 is completely covered with the stacked films 39 to 41 consisting of the Ni film 39, the Pd film 40, and the Au film 41 and covered with the sidewall 36, and its surface is not exposed, and therefore the copper wiring 15 can be restrained from being oxidized or corroded.

Additionally, the platings of the Ni film 39, the Pd film 40, and the Au film 41 can be treated by electroless plating. Electroless plating is bathtub type plating unlike one-by-one type electrolytic plating, and wafers can be treated at a time even if the wafers differ from each other in size. Therefore, the productivity of the semiconductor device 1 can be improved. Additionally, this electroless plating is performed after removing the resist film 33, and therefore it is also possible to avoid the fact that the resist film 33 is deformed by being influenced by the plating temperature (about 90° C.) of electroless plating.

In the second embodiment, an example in which the Au film 41 is excluded can be applied in the same way as in the modification of FIG. 6 of the first embodiment.

<Third Embodiment>

Figure 10:
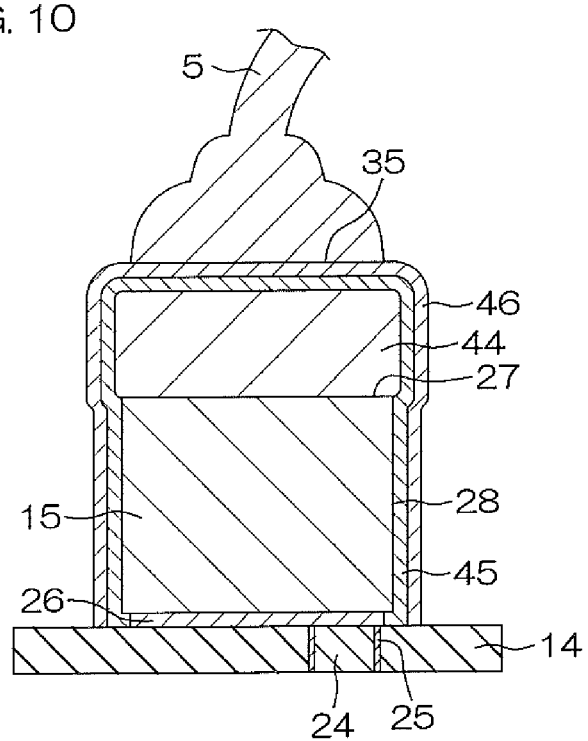
FIG. 10 is a view showing a third embodiment of the copper wiring.

FIG. 10 is a view showing a third embodiment of the copper wiring 15. In FIG. 10, only the copper wiring 15 and regions therearound are shown, and the structure etc., of the semiconductor chip 2 are neither shown nor described. Additionally, in FIG. 10, the same reference sign is given to a component equivalent to each component of FIG. 3 shown above, and a description of this component is omitted.

In this third embodiment, an Ni (nickel) film 44 that is one example of the shock absorbing layer of the present invention, a Pd (palladium) film 45 that is one example of the bonding layer of the present invention, and an Au (gold) film 46 are stacked together in this order from the copper wiring 15 in such a way as to cover each copper wiring 15.

The Ni film 44 projects more sidewardly than the copper wiring 15 when viewed cross-sectionally so as to create a level difference between its side surface and the side surface 28 of the copper wiring 15, and is formed with a uniform thickness on the upper surface 27 of the copper wiring 15. In other words, the Ni film 44 is selectively formed only at the upper surface 27 so as to expose the side surface 28 of the copper wiring 15. A Pd catalyst (not shown) may be interposed between the Ni film 44 and the upper surface 27 of the copper wiring 15. The thickness of the Ni film 44 is, for example, 2 μm to 4 μm.

The Pd film 45 is formed such that its one surface and its other surface follow the surface of the copper wiring 15 and the surface of the Ni film 44, and covers the upper surface and the side surface of the Ni film 44 and covers the side surface 28 of the copper wiring 15 exposed from the Ni film 44. The Pd film 45 is formed with a uniform thickness. The thickness of the Pd film 45 is, for example, 0.1 μm to 0.5 μm.

The Au film 46 is formed such that its one surface and its other surface follow the surface of the copper wiring 15 and the surface of the Ni film 44, and covers the upper surface and the side surface of the Pd film 45. The Au film 46 is formed with a uniform thickness that is thinner than the Pd film 45. The thickness of the Au film 46 is, for example, 0 μm to 0.05 μm.

These stacked films 45 and 46 consisting of the Pd film 45 and the Au film 46 protect the side surface 28 of the copper wiring 15 by covering the side surface 28 as one example of the side protecting layer of the present invention. Additionally, the Ni film 44 is not formed at the side surface 28 in these stacked films 45 and 46, and therefore a part on the side surface 28 of the copper wiring 15 is thinner than the distance from the upper surface 27 of the copper wiring 15 to the wire connection surface 35 (upper surface of the Au film 46) of the copper wire 5 in the stacked films 45 and 46.

In the present embodiment, the copper wiring 15 coated with the Ni film 44, with the Pd film 45, and with the Au film 46 is exposed to the surface of the semiconductor chip 2 in the form of the pad 7. The copper wire 5 is bonded to the Au film 46 exposed to the topmost surface of the pad 7.

Next, a process for manufacturing the copper wiring 15 of the third embodiment will be described.

FIG. 11A to FIG. 11F are views to describe a part of the manufacturing process of the copper wiring 15 of FIG. 10 in order of process steps. In the following description, let it be supposed that electrolytic plating is performed in a temperature environment of, for example, room temperature (about 20° C. or 25° C.) and that electroless plating is performed in a plating solution of, for example, about 90° C.

First, before forming the copper wiring 15, the lower wiring 13 (see FIG. 3) is formed on the semiconductor substrate 12 (see FIG. 3) according to a well-known multi-layer wiring manufacturing technique, and then the passivation film 14 is formed, and the via 24 that penetrates this passivation film 14 is formed.

Figure 11A:
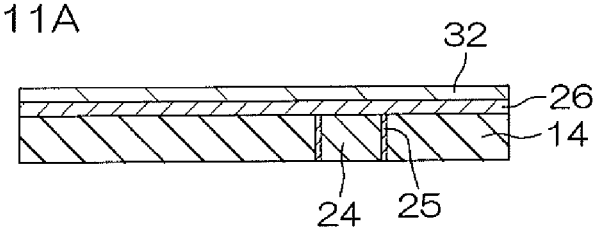

Thereafter, as shown in FIG. 11A, the barrier film 26 and the copper seed film 32 are formed on the surface of the passivation film 14 in this order, for example, according to the sputtering method.

Figure 11B:
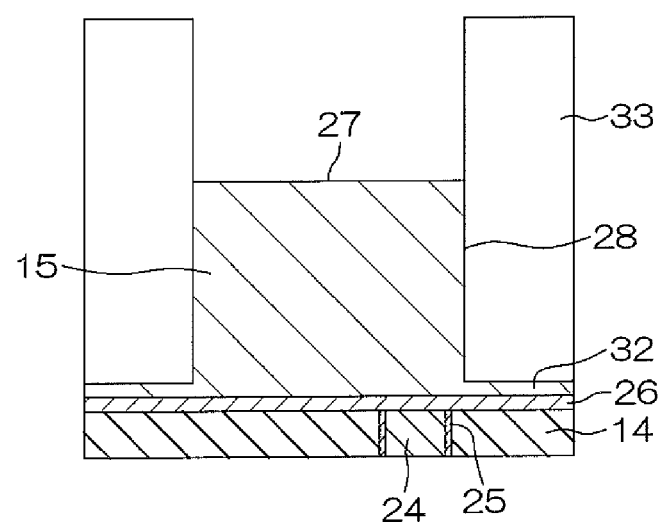

Thereafter, as shown in FIG. 11B, the resist film 33 selectively having an opening in a region in which each copper wiring 15 is to be formed is formed on the copper seed film 32. Thereafter, copper is subjected to plating growth by means of electrolytic plating from the surface of the copper seed film 32 selectively exposed from the opening. As a result, the copper wiring 15 is formed. In this state, the copper wiring 15 has its side surface 28 covered with the resist film 33. Additionally, adjacent copper wirings 15 are in a mutually electrically connected state through the copper seed film 32 covered with the resist film 33.

Figure 11C:
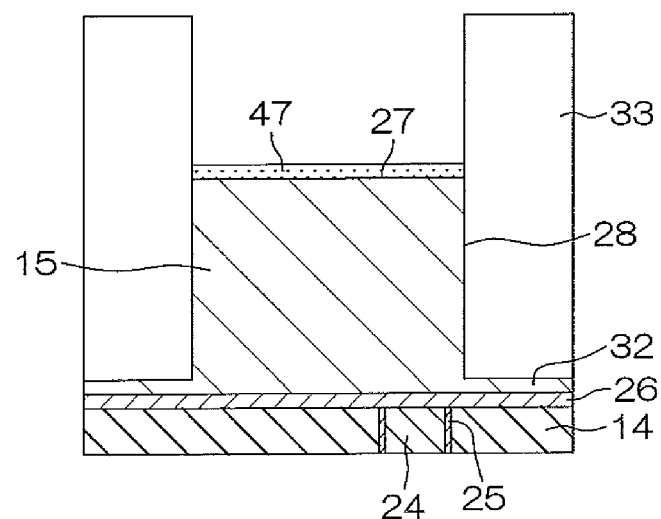

Thereafter, as shown in FIG. 11C, a Pd catalyst 47 is given to the upper surface 27 of the copper wiring 15 selectively exposed from the opening of the resist film 33 in a temperature environment of room temperature (about 20° C. or 25° C.)

Thereafter, as shown in FIG. 11D, the resist film 33 is removed. As a result, the side surface 28 of the copper wiring 15 covered with the resist film 33 and the upper surface 27 to which the Pd catalyst 47 has been given are exposed. Thereafter, Ni is subjected to plating growth from the upper surface 27 of the copper wiring 15 by means of electroless plating.

At this time, the Pd catalyst 47 is not given to the side surface 28 of the copper wiring 15 covered with the resist film 33 when the Pd catalyst 47 is given, and therefore Ni hardly develops plating growth. As a result, Ni isotropically grows from the upper surface 27 of the copper wiring 15, and the Ni film 44 selectively covering only the upper surface 27 of the copper wiring 15 is formed.

Thereafter, as shown in FIG. 11E, the copper seed film 32 other than the copper wiring 15 and the barrier film 26 disposed thereunder are selectively removed, for example, according to wet etching. At this time, the end of the barrier film 26 is etched more inwardly than the side surface 28 of the copper wiring 15 because of characteristics of wet etching (isotropic etching), and a level difference is created between the end of the barrier film 26 and the side surface 28.

Thereafter, as shown in FIG. 11F, Pd and Au are subjected to plating growth in this order by means of electroless plating from the entire surface (side surface 28) of the exposed copper wiring 15 and from the entire surface of the Ni film 44. As a result, the Pd film 45 and the Au film 46 are formed.

The copper wiring 15 coated with the stacked films 44 to 46 consisting of the Ni film 44, the Pd film 45, and the Au film 46 is formed through the steps mentioned above.

As described above, according to the present embodiment, the Pd catalyst 47 is selectively given only to the upper surface 27 of the copper wiring 15 before forming the Ni film 44 (see FIG. 11C). This makes it possible to restrain the plating growth of Ni from the side surface 28 of the copper wiring 15 when the Ni film 44 is subjected to electroless plating. As a result, the protection film (the Pd film 45 and the Au film 46) covering the side surface 28 of the copper wiring 15 can be made thinner than in a case in which Ni, Pd, and Au are evenly grown by electroless plating from the upper surface 27 and the side surface 28 of the bare copper wiring 15.

As a result, the distance between the stacked films 45 and 46 of adjacent copper wirings 15 can be secured comparatively widely, and therefore the occurrence of a wiring-towiring short circuit can be prevented even if the wiring-to-wiring distance L of the copper wiring 15 is shortened. Additionally, the copper wiring 15 is completely covered with the stacked films 44 to 46 consisting of the Ni film 44, the Pd film 45, and the Au film 46, and its surface is not exposed, and therefore the copper wiring 15 can be restrained from being oxidized or corroded.

Additionally, all platings can be treated by electroless plating after giving the Pd catalyst 47. Electroless plating is bathtub type plating unlike one-by-one type electrolytic plating, and wafers can be treated at a time even if the wafers differ from each other in size. Therefore, the productivity of the semiconductor device 1 can be improved. Additionally, this electroless plating is performed after removing the resist film 33, and therefore it is also possible to avoid the fact that the resist film 33 is deformed by being influenced by the plating temperature (about 90° C.) of electroless plating.

In the third embodiment, it is also possible to apply an example in which the Au film 46 is excluded in the same way as in the modification of FIG. 6 of the first embodiment.

<Fourth Embodiment>

FIG. 12 is a view showing a fourth embodiment of the copper wiring 15. In FIG. 12, only the copper wiring 15 and regions therearound are shown, and the structure etc., of the semiconductor chip 2 are neither shown nor described. Additionally, in FIG. 12, the same reference sign is given to a component equivalent to each component of FIG. 3 shown above, and a description of this component is omitted.

In this fourth embodiment, the copper wiring 15 has a projecting portion 48 that projects outwardly at the lower end of its side surface 28. The projecting portion 48 is formed by being drawn out toward both sides in a width direction of the copper wiring 15 with a predetermined thickness.

Additionally, an Ni (nickel) film 49 that is one example of the shock absorbing layer of the present invention, a Pd (palladium) film 50 that is one example of the bonding layer of the present invention, and an Au (gold) film 51 are stacked together in this order from the copper wiring 15 in such a way as to cover each copper wiring 15.

The Ni film 49 is formed on the upper surface 27 of the copper wiring 15 with a uniform thickness such that its side surface becomes flush with the side surface 28 of the copper wiring 15. In other words, the Ni film 49 is selectively formed only at the upper surface 27 so as to expose the side surface 28 of the copper wiring 15. The thickness of the Ni film 49 is, for example, 2 μm to 4 μm.

The Pd film 50 is formed such that its one surface and its other surface follow the surface of the copper wiring 15 and the surface of the Ni film 49, and covers the upper surface and the side surface of the Ni film 49 and covers the side surface 28 of the copper wiring 15 exposed from the Ni film 49. The Pd film 50 is formed with a uniform thickness. The thickness of the Pd film 50 is, for example, 0.1 μm to 0.5 μm.

The Au film 51 is formed such that its one surface and its other surface follow the surface of the copper wiring 15 and the surface of the Ni film 49, and covers the upper surface and the side surface of the Pd film 50. The Au film 51 is formed with a uniform thickness that is thinner than the Pd film 50. The thickness of the Au film 51 is, for example, 0 μm to 0.05 μm.

The Pd film 50 and the Au film 51 cover the side surface 28 from the upper end of the copper wiring 15 to the projecting portion 48 so as to selectively expose the side surface of the projecting portion 48. Near the projecting portion 48, the Pd film 50 and the Au film 51 come around the surface of the projecting portion 48 from the side surface 28 such that the Pd film 50 follows the side surface 28 and the surface of the projecting portion 48. As a result, a part that has come around the projecting portion 48 of the Pd film 50 is interposed between the surface of the projecting portion 48 and the Au film 51.

These stacked films 50 and 51 consisting of the Pd film 50 and the Au film 51 protect the side surface 28 of the copper wiring 15 by covering the side surface 28 as one example of the side protecting layer of the present invention. Additionally, the Ni film 49 is not formed at the side surface 28 in these stacked films 50 and 51, and therefore a part on the side surface 28 of the copper wiring 15 is thinner than the distance from the upper surface 27 of the copper wiring 15 to the wire connection surface 35 (upper surface of the Au film 51) of the copper wire 5 in the stacked films 50 and 51.

In the present embodiment, the copper wiring 15 coated with the Ni film 49, with the Pd film 50, and with the Au film 51 is exposed to the surface of the semiconductor chip 2 in the form of the pad 7. The copper wire 5 is bonded to the Au film 51 exposed to the topmost surface of the pad 7.

Next, a process for manufacturing the copper wiring 15 of the fourth embodiment will be described.

FIG. 13A to FIG. 13F are views to describe a part of the manufacturing process of the copper wiring 15 of FIG. 12 in order of process steps. In the following description, let it be supposed that electrolytic plating is performed in a temperature environment of, for example, room temperature (about 20° C. or 25° C.) and that electroless plating is performed in a plating solution of, for example, about 90° C.

First, before forming the copper wiring 15, the lower wiring 13 (see FIG. 3) is formed on the semiconductor substrate 12 (see FIG. 3) according to a well-known multi-layer wiring manufacturing technique, and then the passivation film 14 is formed, and the via 24 that penetrates this passivation film 14 is formed.

Figure 13A:
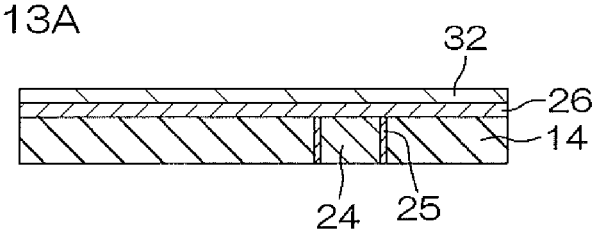

Thereafter, as shown in FIG. 13A, the barrier film 26 and the copper seed film 32 are formed on the surface of the passivation film 14 in this order, for example, according to the sputtering method.

Figure 13B:
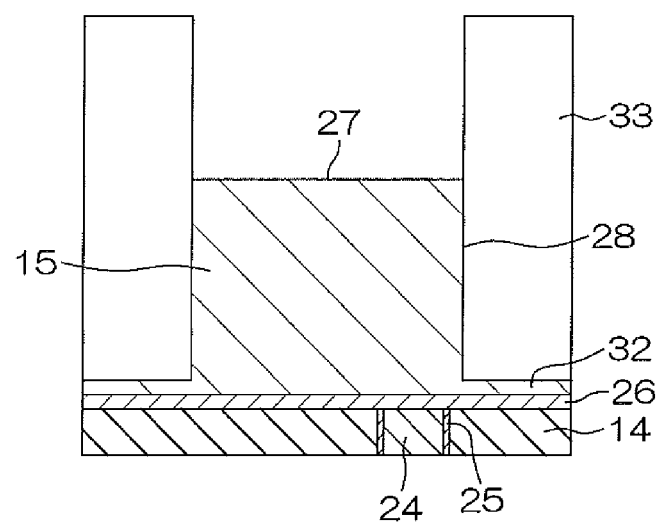

Thereafter, as shown in FIG. 13B, the resist film 33 selectively having an opening in a region in which each copper wiring 15 is to be formed is formed on the copper seed film 32. Thereafter, copper is subjected to plating growth by means of electrolytic plating from the surface of the copper seed film 32 selectively exposed from the opening. As a result, the copper wiring 15 is formed. In this state, the copper wiring 15 has its side surface 28 covered with the resist film 33. Additionally, adjacent copper wirings 15 are in a mutually electrically connected state through the copper seed film 32 covered with the resist film 33.

Figure 13C:
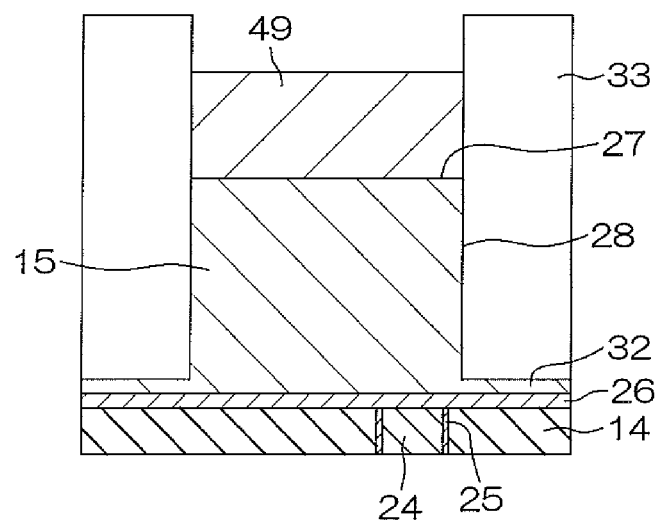

Thereafter, as shown in FIG. 13C, Ni is subjected to plating growth by means of electrolytic plating from the upper surface 27 of the copper wiring 15 selectively exposed from the opening of the resist film 33. As a result, the Ni film 49 (e.g., about 3 μm in thickness) brought into a sandwiched state from both sides by means of the resist film 33 is formed on the upper surface 27 of the copper wiring 15.

Figure 13D:
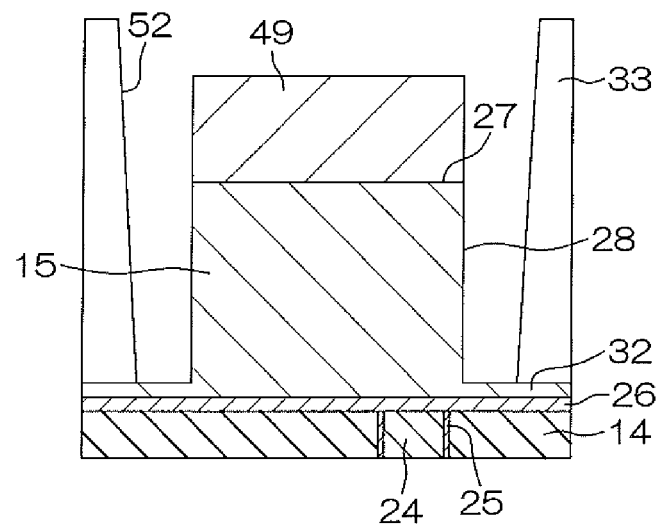

Thereafter, as shown in FIG. 13D, the resist film 33 is selectively etched so as to create a gap 52 between the resist film 33 and the side surface 28 of the copper wiring 15. As a result, the side surface 28 of the copper wiring 15 and apart of the surface of the copper seed film 32 are exposed in the gap 52. Such light etching as to allow the resist film 33 to be etched about 0.2 μm from the side surface 28 of the copper wiring 15, for example, by supplying a dilute-sulfuric-acid etchant is applicable as an etching technique.

Preferably, at this time, the concentration and temperature of the dilute-sulfuric-acid etchant are kept constant.

Figure 13E:
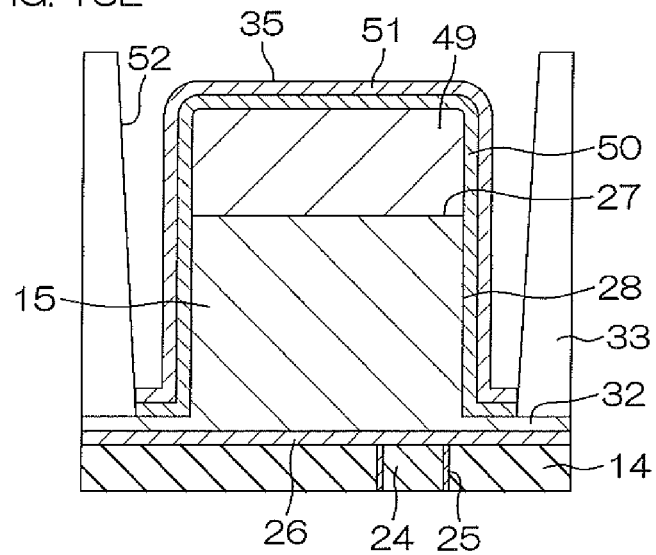

Thereafter, as shown in FIG. 13E, Pd and Au are subjected to plating growth in this order by means of electrolytic plating from the entire surface (side surface 28) of the exposed copper wiring 15 and from the entire surface of the Ni film 49. As a result, the Pd film 50 and the Au film 51 are formed. In this case, Pd and Au grow also from the surface of the copper seed film 32 exposed to the gap 52.

Thereafter, as shown in FIG. 13F, the resist film 33 is removed. Thereafter, the copper seed film 32 outside the Au film 51 and the barrier film 26 disposed thereunder are selectively removed, for example, according to wet etching. At this time, the end of the barrier film 26 is etched more inwardly than the side surface 28 of the copper wiring 15 because of characteristics of wet etching (isotropic etching), and a level difference is created between the end of the barrier film 26 and the side surface 28.

The copper wiring 15 coated with the stacked films 49 to 51 consisting of the Ni film 49, the Pd film 50, and the Au film 51 is formed through the steps mentioned above.

As described above, according to the present embodiment, the Ni film 49 is formed only at the upper surface 27 of the copper wiring 15, and the amount of plating growth can be allowed to fall within the range of the gap 52 of the resist film 33 during the plating of the Pd film 50 and the Au film 51. Therefore, the protection film (the Pa film 50 and the Au film 51) covering the side surface 28 of the copper wiring 15 can be made thinner than in a case in which Ni, Pd, and Au are evenly grown by electroless plating from the upper surface 27 and the side surface 28 of the bare copper wiring 15. Additionally, the resist film 33 is interposed between adjacent copper wirings 15 during the plating of the Pd film 50 and the Au film 51 (see FIG. 13E), and therefore Pd and Au that have grown never come into contact with each other.

As a result, the distance between the stacked films 50 and 51 of adjacent copper wirings 15 can be secured comparatively widely, and therefore the occurrence of a wiring-to-wiring short circuit can be prevented even if the wiring-to-wiring distance L of the copper wiring 15 is shortened. Additionally, the copper wiring 15 is completely covered with the stacked films 49 to 51 consisting of the Ni film 49, the Pd film 50, and the Au film 51, and its surface is not exposed, and therefore the copper wiring 15 can be restrained from being oxidized or corroded.

In the fourth embodiment, it is also possible to apply an example in which the Au film 51 is excluded in the same way as in the modification of FIG. 6 of the first embodiment. Additionally, Ni may be subjected to plating growth prior to the Pd film 50 and the Au film 51 after creating the gap 52 in the resist film 33.

<Reference Example>

Figure 14:
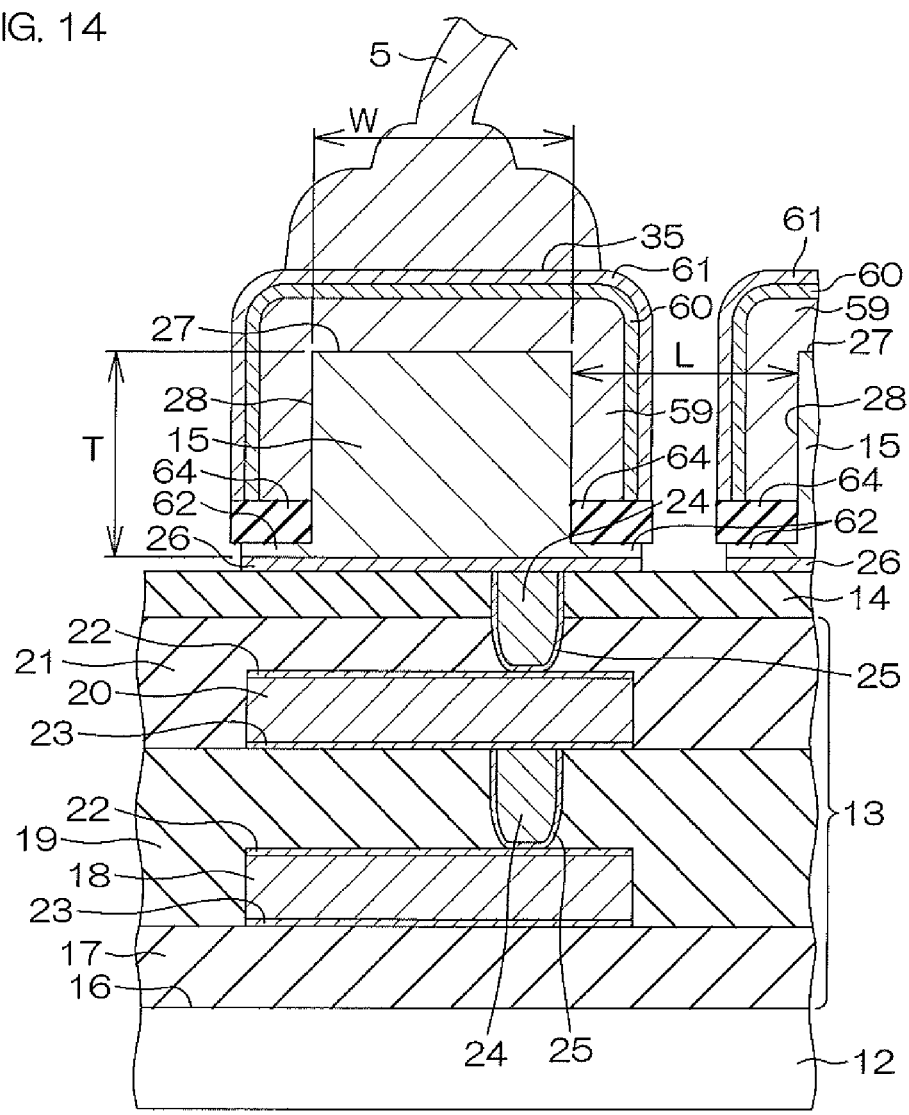
FIG. 14 is a view showing a reference example of the copper wiring.

FIG. 14 is a view showing a reference example of the copper wiring 15. In FIG. 14, only the copper wiring 15 and regions therearound are shown, and the structure etc., of the semiconductor chip 2 are neither shown nor described. Additionally, in FIG. 14, the same reference sign is given to a component equivalent to each component of FIG. 3 shown above, and a description of this component is omitted.

In this reference example, each copper wiring 15 has an integrally-formed copper seed film 62 drawn outwardly at the lower end of the side surface 28. The copper seed film 62 is a drawn portion formed by drawing both sides in the width direction of the copper wiring 15 while having a constant thickness.

A pedestal film 64 that is one example of a second insulating layer is formed on the copper seed film 62. The pedestal film 64 exposes most of the upper and side surfaces 27 and 28 of the copper wiring 15, and selectively surrounds and covers the lower part of the side surface 28 of the copper wiring 15. The lower part of the copper wiring 15 is brought into a sandwiched state by means of the pedestal film 64 from both sides in the width direction when viewed cross-sectionally. The pedestal film 64 is formed with a uniform thickness. The thickness of the pedestal film 64 is, for example, 0.04 μm to 0.5 μm. The pedestal film 64 is made of the same material (SiN) as the passivation film 14.

The barrier film 26 is formed such that its both ends are located inside the side surface of the pedestal film along with the copper seed film 62 when viewed cross-sectionally.

In each copper wiring 15, an Ni (nickel) film 59 that is one example of the shock absorbing layer, a Pd (palladium) film 60 that is one example of the bonding layer, and an Au (gold) film 61 are stacked together in this order from the copper wiring 15 in such a way as to cover a part exposed from the pedestal film 64. The stacked films 59 to 61 have a stacked-layer interface that intersects the surface of the pedestal film 64. In other words, the pedestal film 64 has a shape formed by being drawn from the side surface 28 of the copper wiring 15 along a direction crossing the stacked-layer interface of the stacked films 59 to 61 when viewed cross-sectionally.

The Ni film 59 is formed such that its one surface and its other surface follow the upper surface 27 and the side surface 28 of the copper wiring 15, and covers the whole area of the upper surface 27 and the side surface 28 exposed from the pedestal film 64. The Ni film 59 is formed with a uniform thickness. The thickness of the Ni film 59 is, for example, 2 μm to 4 μm.

The Pd film 60 is formed such that its one surface and its other surface follow the upper surface 27 and the side surface 28 of the copper wiring 15, and covers the whole area of the upper surface and the side surface of the Ni film 59. The Pd film 60 is formed with a uniform thickness that is thinner than the Ni film 59. The thickness of the Pd film 60 is, for example, 0.1 μm to 0.5 μm.

The Au film 61 is formed such that its one surface and its other surface follow the upper surface 27 and the side surface 28 of the copper wiring 15, and covers the whole area of the upper surface and the side surface of the Pd film 60. The Au film 61 is formed with a uniform thickness that is thinner than the Pd film 60. The thickness of the Au film 61 is, for example, 0 μm to 0.05 μm.

These stacked films 59 to 61 consisting of the Ni film 59, the Pd film 60, and the Au film 61 protect the upper surface 27 and the side surface 28 of the copper wiring 15 by covering the upper surface 27 and the side surface 28 as one example of a protective layer. In this reference example, the copper wiring 15 coated with the Ni film 59, with the Pd film 60, and with the Au film 61 is exposed to the surface of the semiconductor chip 2 in the form of the pad 7. The copper wire 5 is bonded to the Au film 61 exposed to the topmost surface of the pad 7.

Next, a process for manufacturing the copper wiring 15 will be described.

FIG. 15A to FIG. 15F are views to describe a part of the manufacturing process of the copper wiring 15 of FIG. 14 in order of process steps. In the following description, let it be supposed that electrolytic plating is performed in a temperature environment of, for example, room temperature (about 20° C. or 25° C.) and that electroless plating is performed in a plating solution of, for example, about 90° C.

First, before forming the copper wiring 15, the lower wiring 13 (see FIG. 14) is formed on the semiconductor substrate 12 (see FIG. 14) according to a well-known multilayer wiring manufacturing technique, and then the passivation film 14 is formed, and the via 24 that penetrates this passivation film 14 is formed.

Figure 15A:
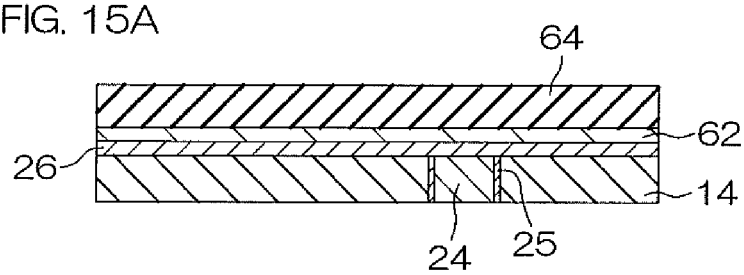
FIG. 15A to FIG. 15F are views to describe a part of a process for manufacturing the copper wiring of FIG. 14.

Thereafter, as shown in FIG. 15A, the barrier film 26 and the copper seed film 62 are formed on the surface of the passivation film 14 in this order, for example, according to the sputtering method. Thereafter, the pedestal film 64 is formed on the copper seed film 62, for example, according to the CVD method.

Figure 15B:
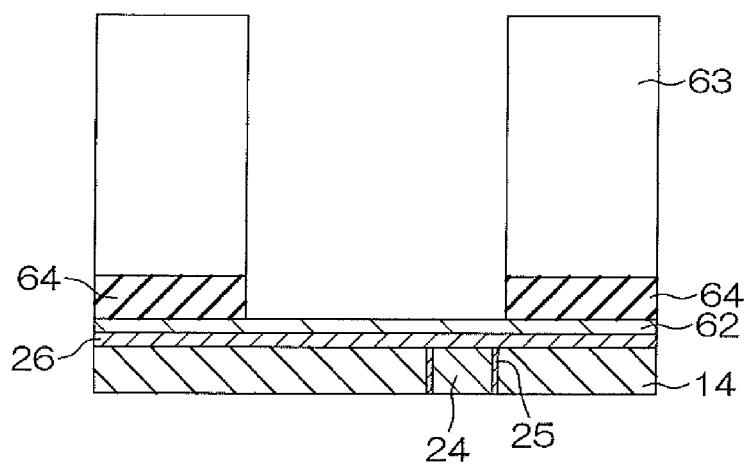

Thereafter, as shown in FIG. 15B, the resist film 63 selectively having an opening in a region in which each copper wiring 15 is to be formed is formed on the pedestal film 64. Thereafter, the pedestal film 64 exposed from the opening of the resist film 63 is selectively removed according to dry etching (chlorofluorocarbon-based dry etching) that uses the resist film 63 as a mask. As a result, the copper seed film 62 is selectively exposed in the opening of the resist film 63.

Figure 15C:
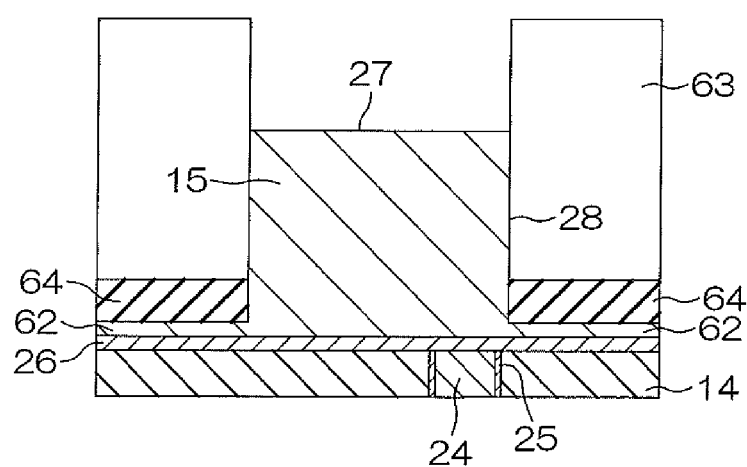

Thereafter, as shown in FIG. 15C, copper is subjected to plating growth by means of electrolytic plating from the surface of the copper seed film 62 selectively exposed from the opening of the resist film 63. As a result, the copper wiring 15 is formed. In this state, the copper wiring 15 has its side surface 28 covered with the resist film 63.

Figure 15D:
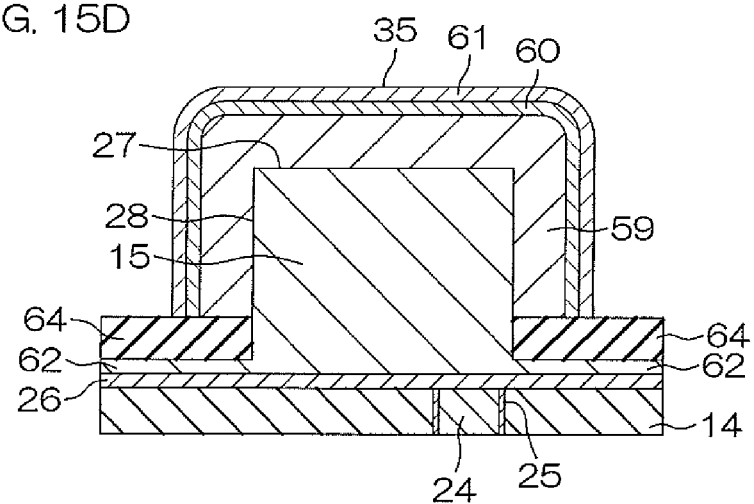

Thereafter, as shown in FIG. 15D, the resist film 63 is removed. As a result, the side surface 28 of the copper wiring 15 covered with the resist film 63 is exposed. Thereafter, Ni, Pd, and Au are subjected to plating growth in this order by means of electroless plating from the entire surface (the upper surface 27 and the side surface 28) of the exposed copper wiring 15. Ni, Pd, and Au isotropically develop plating growth along the surface of the pedestal film 64 with a uniform thickness because of electroless plating. As a result, the stacked films 59 to 61 consisting of the Ni film 59, the Pd film 60, and the Au film 61 are formed.

Figure 15E:
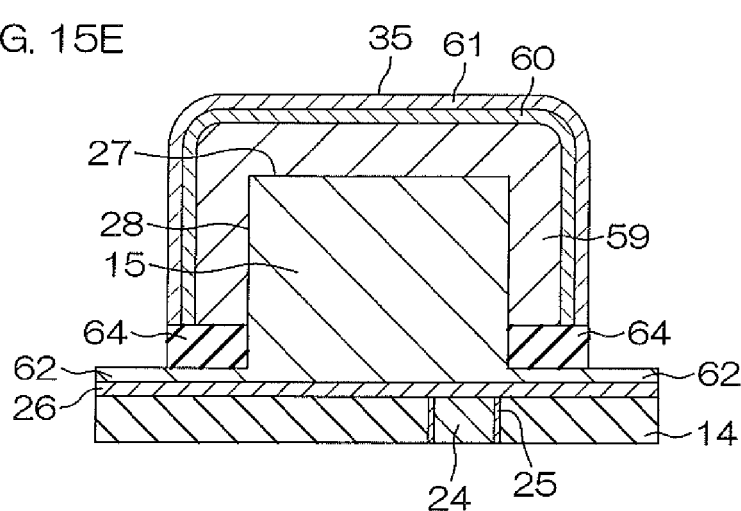

Thereafter, as shown in FIG. 15E, the pedestal film 64 outside the stacked films 59 to 61 is selectively removed according to dry etching (chlorofluorocarbon-based dry etching) so as to leave a part between the stacked films 59 to 61 and the copper seed film 62.

Figure 15F:
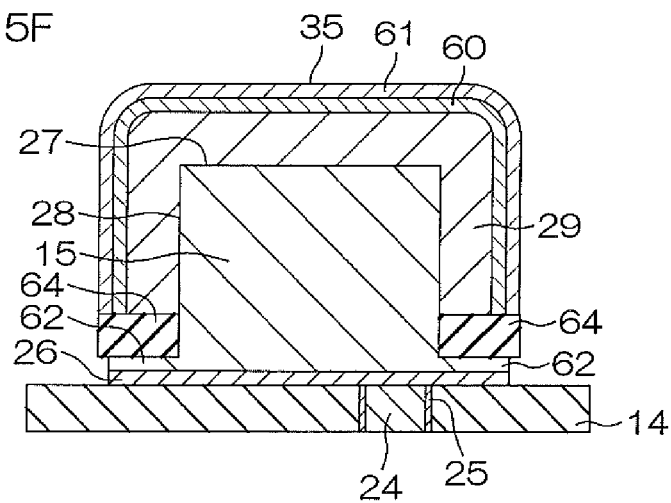

Thereafter, as shown in FIG. 15F, parts other than the part disposed under the pedestal film 64 in the copper seed film 62 and the barrier film 26 are selectively removed, for example, according to wet etching. At this time, the end of the copper seed film 62 and the end of the barrier film 26 are etched more inwardly than the side surface of the pedestal film 64 because of characteristics of wet etching (isotropic etching), and a level difference is created between the side surface of the pedestal film 64 and the ends of the copper seed film 62 and the barrier film 26.

The copper wiring 15 coated with the stacked films 59 to 61 consisting of the Ni film 59, the Pd film 60, and the Au film 61 is formed through the steps mentioned above.

As described above, according to the present reference example, the plating interface of the stacked films 59 to 61 consisting of the Ni film 59, the Pd film 60, and the Au film 61 is formed on the pedestal film 64 (see FIG. 15D). This pedestal film 64 is a film formed on the copper seed film 62 before etching the copper seed film 62 and the barrier film 26. Therefore, residues (etching residues such as Cu and Ti) generated when the copper seed film 62 and the barrier film 26 are etched do not exist on the surface of the pedestal film 64 on which the stacked films 59 to 61 develop plating growth. Therefore, metallic particles that nucleate such etching residues can be prevented from developing plating growth in regions other than the region in which the stacked films 59 to 61 are formed between adjacent copper wirings 15. Even if a plating core exists between the adjacent copper wirings 15 because of some factor and even if metallic particles develop plating growth from the core, the metallic particles will be removed along with a needless part of the pedestal film 64 in the step of FIG. 15E, and therefore the metallic particles will never become a leak path of a wiring-to-wiring short circuit. Additionally, even if etching residues are generated when the copper seed film 62 and the barrier film 26 are etched (see FIG. 15F), grain growth will never be developed to such an extent that these residues become a leak path because a plating step is not performed thereafter. As a result, there are no metallic particles that become a leak path even if the wiring-to-wiring distance L of the copper wiring 15 is shortened, and therefore the occurrence of a wiring-to-wiring short circuit can be prevented.

Additionally, the copper wiring 15 is completely covered with the stacked films 59 to 61 consisting of the Ni film 59, the Pd film 60, and the Au film 61, and its surface is not exposed, and therefore the copper wiring 15 can be restrained from being oxidized or corroded.

Additionally, in the present reference example, all of the Ni film 59, the Pd film 60, and the Au film 61 are treated by electroless plating. Electroless plating is bathtub type plating unlike one-by-one type electrolytic plating, and wafers can be treated at a time even if the wafers differ from each other in size. Therefore, the productivity of the semiconductor device 1 can be improved. Additionally, this electroless plating is performed after removing the resist film 63, and therefore it is also possible to avoid the fact that the resist film 63 is deformed by being influenced by the plating temperature (about 90° C.) of electroless plating.

With regard to the copper wiring 15 of the reference example, a modification shown in FIG. 16 can also be applied.

In FIG. 16, the Ni film 59 is selectively formed only on the surface 27 so as to expose the side surface 28 of the copper wiring 15. In this case, the side surface 28 of the copper wiring 15 is covered with the stacked films 60 and 61 consisting of the Pd film 60 and the Au film 61. This arrangement can be obtained by forming the copper wiring 15 in, for example, the step of FIG. 15C, thereafter by forming the Ni film 59 while allowing Ni to develop plating growth by means of electrolytic plating, and by excluding the electroless plating of Ni in the step of FIG. 15D. In other words, the Ni film 59 is formed by plating growth in the opening of the resist film 63, and therefore its side surface becomes flush with the side surface 28 of the copper wiring 15 (there is no level difference).

Although the embodiments of the present invention and the reference example have been described as above, the present invention and the reference example can be embodied in still another mode.

For example, a gold wire can also be used instead of the copper wire 5.

Additionally, although a case in which the lower wiring 13 has a two-layer structure has been mentioned as one example in the aforementioned embodiments and the reference example, the lower wiring 13 may be a single-layer structure, a three-layer structure, and a four- or more layer structure.

Additionally, in the reference example, adjacent copper wirings 15 are in a mutually electrically connected state through the copper seed film 62 covered with the resist film 63, for example, in the plating step of FIG. 15D. Therefore, the stacked films 59 to 61 consisting of the Ni film 59, the Pd film 60, and the Au film 61 can be grown by electrolytic plating with respect to all of the copper wirings 15 by use of the copper seed film 62. If electrolytic plating is employed, the plating of Ni, Pd, and Au can be performed by using one device. Additionally, the Au film 61 is not necessarily required, and can be excluded.

The embodiments of the present invention are merely specific examples used to clarify the technical contents of the present invention, and the present invention should not be understood as being limited to these examples, and the spirit and scope of the present invention are to be determined solely by the appended claims.

From the contents of the aforementioned embodiments, the following features can be extracted besides the invention recited in the appended claims.

(Item 1)

A method for manufacturing a semiconductor device including a step of forming a copper wiring for wire connection on an insulating layer, a step of forming a mask so as to expose an upper surface of the copper wiring and cover a side surface of the copper wiring, a step of forming a shock absorbing layer on the upper surface of the copper wiring by plating the exposed upper surface of the copper wiring with a metallic material with a hardness higher than copper, and a step of forming a bonding layer having a connection surface for a wire on the side surface of the copper wiring and on the shock absorbing layer by removing the mask and then by performing plating with a metallic material.

According to this method, the shock absorbing layer is selectively formed on the upper surface of the copper wiring in a state in which the side surface of the copper wiring is covered with the mask. This makes it possible to secure a shock absorbing layer having a film thickness necessary to absorb a shock caused when a bonding wire is bonded in a region on the upper surface of the copper wiring. As a result, in subsequent steps, it is only necessary to completely stop growing a material of the shock absorbing layer on the upper surface of the copper wiring, or it is only necessary to grow the material of the shock absorbing layer comparatively thinly. Therefore, the amount of plating growth from the side surface of the copper wiring can be reduced, and therefore the thickness of the layer on the side surface of the copper wiring can be thinned.

(Item 2)

The method for manufacturing a semiconductor device according to Item 1, wherein the step of forming the shock absorbing layer includes a step of performing electrolytic plating with the material of the shock absorbing layer, and the step of forming the bonding layer includes a step of performing electroless plating with the material of the bonding layer.

According to this method, the plating step while the copper wiring is covered with the mask is performed by electrolytic plating, and the step after the mask has been removed is performed by electroless plating, and therefore it is possible to avoid the fact that the mask is deformed by being influenced by the plating temperature of electroless plating.

On the other hand, electroless plating is bathtub type plating unlike one-by-one type electrolytic plating, and wafers can be treated at a time even if the wafers differ from each other in size. Therefore, the productivity of the semiconductor device can be improved by positively employing electroless plating in a situation in which the influence of the aforementioned plating temperature is not undergone even when electroless plating is performed.

(Item 3)

The method for manufacturing a semiconductor device according to Item 1 or Item 2, wherein the step of forming the bonding layer includes a step of performing plating with the material of the bonding layer so as to become contiguous to the side surface of the exposed copper wiring by removing the mask.

According to this method, the thickness of the layer formed on the side surface of the copper wiring can be made thinner in proportion to an extent resulting from the fact that the shock absorbing layer is not formed on the side surface of the copper wiring.

(Item 4)

The method for manufacturing a semiconductor device according to Item 1 or Item 2, wherein the step of forming the shock absorbing layer includes a step of further operating plating with the material of the shock absorbing layer from the side surface of the copper wiring and from a surface of the shock absorbing layer before forming the bonding layer.

(Item 5)

A method for manufacturing a semiconductor device including a step of forming a copper wiring for wire connection on an insulating layer, a step of forming a sidewall made of an insulating material so as to expose an upper surface of the copper wiring and cover a side surface of the copper wiring, a step of forming a shock absorbing layer on the upper surface of the copper wiring by performing plating with a metallic material with a hardness higher than copper from the exposed upper surface of the copper wiring, and a step of forming a bonding layer to which a wire is bonded on the shock absorbing layer by further performing plating with a metallic material on the shock absorbing layer.

According to this method, the sidewall covering the side surface of the copper wiring is formed before forming the shock absorbing layer and the bonding layer. Therefore, when the plating of the shock absorbing layer and the plating of the bonding layer are performed, the material of the shock absorbing layer and the material of the bonding layer can be prevented from developing plating growth from the side surface of the copper wiring. Therefore, the amount of plating growth from the side surface of the copper wiring can be reduced, and therefore the thickness of the layer formed on the side surface of the copper wiring can be made thinner.

(Item 6)

The method for manufacturing a semiconductor device according to Item 5, wherein the step of forming the shock absorbing layer and the step of forming the bonding layer both include a step of performing electroless plating.

According to this method, the productivity of the semiconductor device can be improved by forming both the shock absorbing layer and the bonding layer by means of electroless plating.

(Item 7)

The method for manufacturing a semiconductor device according to Item 5 or Item 6, wherein the sidewall is made of an SiN film.

(Item 8)

A method for manufacturing a semiconductor device including a step of forming a copper wiring for wire connection on an insulating layer, a step of forming a mask so as to expose an upper surface of the copper wiring and cover a side surface of the copper wiring, a step of removing the mask after applying a catalyst onto the exposed upper surface of the copper wiring, a step of selectively forming a shock absorbing layer on the catalyst by performing plating with a metallic material with a hardness higher than copper after removing the mask, and a step of forming a bonding layer having a connection surface for a wire on the side surface of the copper wiring and on the shock absorbing layer by further performing plating with a metallic material after forming the shock absorbing layer.

According to this method, a catalyst is selectively given only to the upper surface of the copper wiring before forming the shock absorbing layer. This makes it possible to restrain the material of the shock absorbing layer from developing plating growth from the side surface of the copper wiring when the shock absorbing layer is plated. Therefore, the amount of plating growth from the side surface of the copper wiring can be reduced, and therefore the thickness of the layer formed on the side surface of the copper wiring can be made thinner.

(Item 9)

The method for manufacturing a semiconductor device according to Item 8, wherein the step of forming the shock absorbing layer and the step of forming the bonding layer both include a step of performing electroless plating.

According to this method, the productivity of the semiconductor device can be improved by forming both the shock absorbing layer and the bonding layer by means of electroless plating.

(Item 10)

A method for manufacturing a semiconductor device including a step of forming a copper wiring for wire connection on an insulating layer, a step of forming a mask so as expose an upper surface of the copper wiring and to cover a side surface of the copper wiring, a step of forming a shock absorbing layer on the upper surface of the copper wiring by performing plating with a metallic material with a hardness higher than copper from the exposed upper surface of the copper wiring, a step of forming a gap between the mask and the side surface of the copper wiring by selectively etching the mask, and a step of forming a bonding layer having a connection surface for a wire on the side surface of the copper wiring and on the shock absorbing layer by further performing plating with a metallic material after forming the gap.

According to this method, the amount of plating growth can be set to fall within the range of the gap of the mask when the bonding layer is plated. Therefore, the amount of plating growth from the side surface of the copper wiring can be reduced, and therefore the thickness of the layer formed on the side surface of the copper wiring can be made thinner.

(Item 11)

The method for manufacturing a semiconductor device according to Item 10, wherein the step of forming the shock absorbing layer and the step of forming the bonding layer both include a step of performing electrolytic plating.

According to this method, the problem of deformation of the mask can be avoided by performing the plating step during which the copper wiring is covered with the mask by means of electrolytic plating.

(Item 12)

The method for manufacturing a semiconductor device according to any one of Item 1 to Item 11, wherein the step of forming the shock absorbing layer includes a step of plating an Ni film.

(Item 13)

The method for manufacturing a semiconductor device according to any one of Item 1 to Item 12, wherein the step of forming the bonding layer includes a step of plating a Pd film and an Au film in this order.

(Item 14)

The method for manufacturing a semiconductor device according to any one of Item 1 to Item 13, further including a step of forming a barrier film between the insulating layer and the copper wiring.

Additionally, from the contents of the aforementioned reference example, the following features can be extracted.

(Item 1)

A semiconductor device including a first insulating layer, a copper wiring for wire connection formed on the first insulating layer, a second insulating layer surrounding the copper wiring and selectively covering a lower part of a side surface of the copper wiring, a copper seed layer disposed between the first insulating layer and the second insulating layer, the copper seed layer formed integrally with the copper wiring, and a protective layer made of a metallic material covering an upper surface and a side surface of the copper wiring on the second insulating layer.

This semiconductor device can be manufactured according to a method for manufacturing a semiconductor device recited in Item 10 mentioned below.

(Item 2)

The semiconductor device according to Item 1, wherein the protective layer includes a shock absorbing layer formed on the copper wiring, the shock absorbing layer being made of a metallic material with a hardness higher than copper and a bonding layer for a wire formed on the shock absorbing layer.

(Item 3)

The semiconductor device according to Item 2, wherein the protective layer has a stacked structure consisting of the shock absorbing layer and the bonding layer in a whole area thereof.

(Item 4)

The semiconductor device according to Item 2, wherein the protective layer has a stacked structure consisting of the shock absorbing layer and the bonding layer in a region on the upper surface of the copper wiring, and has the bonding layer contiguous to the side surface of the copper wiring in a region on the side surface of the copper wiring.

(Item 5)

The semiconductor device according to any one of Item 2 to Item 4, wherein the shock absorbing layer is made of an Ni film.

(Item 6)

The semiconductor device according to any one of Item 2 to Item 5, wherein the bonding layer includes a stacked structure consisting of a Pd film and an Au film that are stacked in this order from the shock absorbing layer.

(Item 7)

The semiconductor device according to any one of Item 1 to Item 6, wherein the first insulating layer and the second insulating layer are both made of an SiN film.

(Item 8)

The semiconductor device according to any one of Item 1 to Item 7, further including a barrier film interposed between the first insulating layer and the copper wiring.

(Item 9)

The semiconductor device according to any one of Item 1 to Item 8, wherein a plurality of copper wirings each of which is the copper wiring are formed at a wiring-to-wiring distance of less than 20 µm.

According to this arrangement, the wiring-to-wiring distance is less than 20 µm, and therefore the wiring can be greatly reduced in size.

(Item 10)

A method for manufacturing a semiconductor device including a step of forming a copper seed layer on a first insulating layer, a step of forming a second insulating layer having an opening that selectively exposes an upper surface of the copper seed layer, a step of forming a copper wiring for wire connection so as to protrude from the second insulating layer by plating the exposed upper surface of the copper seed layer with copper, a step of forming a protective layer covering an upper surface and a side surface of the copper wiring by plating the copper wiring exposed from the second insulating layer with a metallic material, and a step of exposing the first insulating layer by selectively removing a part of the second insulating layer exposed from the protective layer and by selectively removing the copper seed layer directly thereunder.

According to this method, a plating interface of the protective layer is formed between the second insulating layer and the protective layer. This second insulating layer is a layer formed on the copper seed layer. For example, etching residues of the copper seed layer or etching residues a barrier film which is formed between the copper seed layer and the first insulating layer do not exist on the second insulating layer. Therefore, metallic particles that nucleate these etching residues can be prevented from developing plating growth at a part other than the protective layer. As a result, there are no metallic particles that become a leak path even if the wiring-to-wiring distance of the copper wiring is shortened, and therefore the occurrence of a wiring-to-wiring short circuit can be prevented.

Additionally, the copper wiring is completely covered with the protective layer, and its surface is not exposed, and therefore the copper wiring can be restrained from being oxidized or corroded.

(Item 11)

The method for manufacturing a semiconductor device according to Item 10, wherein the step of forming the protective layer includes a step of forming a shock absorbing layer on the copper wiring by performing plating with a metallic material with a hardness higher than copper and a step of forming the bonding layer for a wire on the shock absorbing layer.

The semiconductor device according to Item 2 extracted from the reference example can be manufactured by this method.

Additionally, the protective layer can be formed by forming the shock absorbing layer and the bonding layer, and therefore the manufacturing process can be simplified.

(Item 12)

The method for manufacturing a semiconductor device according to Item 11, wherein the step of forming the shock absorbing layer includes a step of forming the shock absorbing layer on an entire surface of the copper wiring exposed from the second insulating layer, and the step of forming the bonding layer includes a step of forming the bonding layer on an entire surface of the shock absorbing layer.

The semiconductor device according to Item 3 extracted from the reference example can be manufactured by this method.

Additionally, the plating of the entire surface of the shock absorbing layer and the plating of the entire surface of the bonding layer are employed, and therefore, for example, a step of selectively covering the surface of the copper wiring during plating formation can be excluded. Therefore, the manufacturing process can be made even simpler.

(Item 13)

The method for manufacturing a semiconductor device according to Item 11, wherein the step of forming the shock absorbing layer includes a step of selectively forming the shock absorbing layer on the upper surface of the copper wiring so that plating is not applied onto the side surface of the copper wiring, and the step of forming the bonding layer includes a step of forming the bonding layer so as to be contiguous to the side surface of the copper wiring.

The semiconductor device according to Item 4 extracted from the reference example can be manufactured by this method.

(Item 14)

The method for manufacturing a semiconductor device according to any one of Item 10 to Item 13, wherein the step of forming the protective layer includes a step of performing electroless plating with the metallic material.

Electroless plating is bathtub type plating unlike one-by-one type electrolytic plating, and wafers can be treated at a time even if the wafers differ from each other in size. Therefore, the productivity of the semiconductor device can be improved by employing electroless plating.

(Item 15)

The method for manufacturing a semiconductor device according to any one of Item 10 to Item 13, wherein the step of forming the protective layer includes a step of performing electrolytic plating with the metallic material.

The invention claimed is:

1. A semiconductor device comprising:
    a semiconductor chip including:
        a semiconductor substrate;
        a multilayer wiring structure disposed on the semiconductor substrate, the multilayer wiring structure including at least one insulating layer and at least one wiring layer;
        a copper wiring for wire connection formed on the at least one insulating layer;
        a shock absorbing layer formed on an upper surface of the copper wiring, the shock absorbing layer being made of a metallic material with a hardness higher than copper;
        a bonding layer formed on the shock absorbing layer, the bonding layer having a connection surface;
        a side protecting layer covering a side surface of the copper wiring from an upper end of the side surface to a lower end of the side surface, and
        a barrier film interposed between the at least one insulating layer and the copper wiring;
    a first lead on which the semiconductor chip is mounted;
    a second lead separated from the first lead; and
    a bonding wire bonded to the connection surface of the bonding layer and the second lead, wherein
    the barrier film has an end surface positioned farther inside than the side surface of the copper wiring such that a level difference along a surface of the semiconductor substrate is formed between the end surface of the barrier film and the side surface of the copper wiring,
    the side protecting layer has a thickness thinner than a distance from the upper surface of the copper wiring to the connection surface of the bonding layer,
    a portion of the side protecting layer is disposed in the level difference while reaching the at least one insulating layer, and
    the at least one wiring layer is disposed directly beneath a connection portion of the connection surface to which the bonding wire is bonded.

2. The semiconductor device according to claim 1, wherein the shock absorbing layer is selectively formed only on the upper surface of the copper wiring.

3. The semiconductor device according to claim 2, wherein the bonding layer has a first portion covering the side surface of the copper wiring and a second portion covering an upper surface of the shock absorbing layer, and the side protecting layer includes the first portion of the bonding layer.

4. The semiconductor device according to claim 3, wherein the copper wiring has a projecting portion projecting outwardly at the lower end of the side surface, and the side protecting layer covers the side surface of the copper wiring from an upper end of the copper wiring to the projecting portion.

5. The semiconductor device according to claim 2, wherein the side protecting layer includes a sidewall made of an insulating material.

6. The semiconductor device according to claim 5, wherein the sidewall is made of an SiN film.

7. The semiconductor device according to claim 3, wherein the shock absorbing layer has a side surface flush with the side surface of the copper wiring.

8. The semiconductor device according to claim 3, wherein the shock absorbing layer projects more sidewardly than the copper wiring such that a level difference is formed between a side surface of the shock absorbing layer and the side surface of the copper wiring.

9. The semiconductor device according to claim 1, wherein the shock absorbing layer has a first portion covering the side surface of the copper wiring and a second portion covering the upper surface of the copper wiring, the first portion having a thickness thinner than a thickness of the second portion, and the side protecting layer includes the first portion of the shock absorbing layer.

10. The semiconductor device according to claim 9, wherein the bonding layer has a first portion covering the first portion of the shock absorbing layer and a second portion covering the second portion of the shock absorbing layer, and the side protecting layer further includes the first portion of the bonding layer.

11. The semiconductor device according to claim 1, wherein the shock absorbing layer is made of an Ni film.

12. The semiconductor device according to claim 1, wherein the bonding layer includes a stacked structure consisting of a Pd film and an Au film stacked in that stated order from the shock absorbing layer.

13. The semiconductor device according to claim 1, wherein the level difference is below the copper wiring.

14. The semiconductor device according to claim 1, wherein the barrier film is made of Ti.

15. The semiconductor device according to claim 1, wherein a plurality of copper wirings, each of which is the copper wiring, are formed at a wiring-to-wiring distance of less than 20 µm.

16. The semiconductor device according to claim 1, wherein a part of the shock absorbing layer disposed on the upper surface of the copper wiring has a 2 µm to 4 µm thickness.

17. The semiconductor device according to claim 1, wherein the at least one insulating layer includes a passivation film formed on a topmost surface of the multilayer wiring structure.

18. The semiconductor device according to claim 1, wherein the side protecting layer completely covers the side surface of the copper wiring from an upper end of the copper wiring to a lower end of the copper wiring.

* * * * *